(12) United States Patent
Zhang et al.

(10) Patent No.: US 9,130,727 B2
(45) Date of Patent: Sep. 8, 2015

(54) CONTROL MODE PHY FOR WLAN

(75) Inventors: Hongyuan Zhang, Fremont, CA (US); Rohit U. Nabar, Sunnyvale, CA (US); Raja Banerjea, Sunnyvale, CA (US); Yong Liu, Campbell, CA (US); Sudhir Srinivasa, Sunnyvale, CA (US); Hyukjoon Kwon, San Diego, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 542 days.

(21) Appl. No.: 13/366,064

(22) Filed: Feb. 3, 2012

(65) Prior Publication Data

US 2012/0201316 A1    Aug. 9, 2012

Related U.S. Application Data

(60) Provisional application No. 61/439,777, filed on Feb. 4, 2011, provisional application No. 61/440,804, filed on Feb. 8, 2011, provisional application No. 61/454,444, filed on Mar. 18, 2011, provisional (Continued)

(51) Int. Cl.
*H04L 27/00*    (2006.01)
*H04J 11/00*    (2006.01)
*H03M 13/23*    (2006.01)
*H04L 1/00*    (2006.01)
(Continued)

(52) U.S. Cl.
CPC .............. *H04L 1/0065* (2013.01); *H03M 13/23* (2013.01); *H04L 1/0046* (2013.01); *H04L 1/08* (2013.01); *H04L 27/2602* (2013.01); *H04L 27/265* (2013.01); *H04L 27/2613* (2013.01)

(58) Field of Classification Search
CPC ... H04L 1/0003; H04L 1/0071; H04L 5/0007; H04L 1/0009; H04L 27/0008; H04L 1/0054; H04L 1/005; H04L 25/067; H04L 1/0066; H04L 27/2647; H04L 27/2662; H04L 27/2602; H03M 13/41
USPC ........... 375/262, 295; 370/203, 210; 714/752, 714/786
See application file for complete search history.

(56) References Cited

U.S. PATENT DOCUMENTS 7,046,746 B1    5/2006    Keaney et al.
8,144,647 B2    3/2012    Nabar et al.
(Continued)

FOREIGN PATENT DOCUMENTS

WO    WO-03005652 A1    1/2003
WO    WO-2006/025996 A2    3/2006
(Continued)

OTHER PUBLICATIONS

International Search Report and Written Opinion for International Application No. PCT/US2012/023832, mailed Jun. 19, 2012.

(Continued)

*Primary Examiner* — Tesfaldet Bocure

(57) ABSTRACT

In a method for generating a physical layer (PHY) data unit for transmission via a communication channel, information bits to be included in the PHY data unit are encoded using a forward error correction (FEC) encoder. The information bits are mapped to a constellation symbols. Additionally, either the information bits are encoded according to a block coding scheme, or the constellation symbols are encoded according to the block coding scheme. Orthogonal frequency division multiplexing (OFDM) symbols are generated to include the constellation symbols and the PHY data unit is generated to include the OFDM symbols.

26 Claims, 35 Drawing Sheets

Related U.S. Application Data application No. 61/477,076, filed on Apr. 19, 2011, provisional application No. 61/480,238, filed on Apr. 28, 2011, provisional application No. 61/490,447, filed on May 26, 2011, provisional application No. 61/492,464, filed on Jun. 2, 2011, provisional application No. 61/499,964, filed on Jun. 22, 2011, provisional application No. 61/500,505, filed on Jun. 23, 2011, provisional application No. 61/515,244, filed on Aug. 4, 2011, provisional application No. 61/524,263, filed on Aug. 16, 2011.

(51) Int. Cl.
   *H04L 27/26* (2006.01)
   *H04L 1/08* (2006.01)

(56) References Cited

U.S. PATENT DOCUMENTS

| | | | |
|---|---|---|---|
| 8,331,419 | B2 | 12/2012 | Zhang et al. |
| 8,462,863 | B1 | 6/2013 | Zhang et al. |
| 8,494,089 | B2 | 7/2013 | Aoki et al. |
| 8,498,362 | B2 | 7/2013 | Zhang et al. |
| 8,527,853 | B2 | 9/2013 | Lakkis |
| 8,542,589 | B2 | 9/2013 | Surineni et al. |
| 8,867,653 | B2 | 10/2014 | Zhang et al. |
| 8,885,740 | B2 | 11/2014 | Zhang et al. |
| 8,948,283 | B2 | 2/2015 | Zhang |
| 2002/0188908 | A1* | 12/2002 | Yonge et al. ............... 714/779 |
| 2004/0081131 | A1* | 4/2004 | Walton et al. .............. 370/344 |
| 2006/0034384 | A1 | 2/2006 | Lee |
| 2008/0298435 | A1 | 12/2008 | Lakkis |
| 2008/0299962 | A1 | 12/2008 | Kasher |
| 2009/0034635 | A1 | 2/2009 | Von Elbwart et al. |
| 2009/0086699 | A1* | 4/2009 | Niu et al. .................. 370/342 |
| 2009/0196163 | A1 | 8/2009 | Du |
| 2009/0285319 | A1 | 11/2009 | Zhang et al. |
| 2010/0034323 | A1* | 2/2010 | Stoye ....................... 375/341 |
| 2010/0046656 | A1 | 2/2010 | van Nee et al. |
| 2010/0091673 | A1 | 4/2010 | Sawai et al. |
| 2010/0091675 | A1 | 4/2010 | Sawai |
| 2010/0103920 | A1* | 4/2010 | Damnjanovic et al. ..... 370/344 |
| 2010/0260159 | A1 | 10/2010 | Zhang et al. |
| 2010/0309834 | A1 | 12/2010 | Fischer et al. |
| 2010/0313098 | A1* | 12/2010 | Lee et al. .................. 714/752 |
| 2011/0002219 | A1 | 1/2011 | Kim et al. |
| 2011/0004804 | A1* | 1/2011 | Xu et al. .................... 714/758 |
| 2011/0032875 | A1 | 2/2011 | Erceg et al. |
| 2011/0122846 | A1* | 5/2011 | Yu et al. .................... 370/335 |
| 2011/0134899 | A1 | 6/2011 | Jones, IV et al. |
| 2011/0142020 | A1 | 6/2011 | Kang et al. |
| 2011/0299382 | A1 | 12/2011 | Van Nee et al. |
| 2011/0305296 | A1 | 12/2011 | Van Nee |
| 2012/0039406 | A1 | 2/2012 | Srinivasa et al. |
| 2012/0294268 | A1* | 11/2012 | Lee et al. .................. 370/329 |
| 2012/0300874 | A1 | 11/2012 | Zhang |
| 2013/0121244 | A1* | 5/2013 | Vermani et al. ............ 370/328 |
| 2014/0029681 | A1 | 1/2014 | Zhang et al. |
| 2015/0030101 | A1* | 1/2015 | Zhang et al. ............... 375/295 |

FOREIGN PATENT DOCUMENTS

| | | | |
|---|---|---|---|
| WO | WO-2008/046163 | A1 | 4/2008 |
| WO | WO-2009-059229 | A1 | 5/2009 |
| WO | WO-2009/084926 | A1 | 7/2009 |
| WO | WO-2009/114612 | A1 | 9/2009 |
| WO | WO-2012/122119 | A1 | 9/2012 |

OTHER PUBLICATIONS

Yu et al., "Coverage extetion for IEEE802.11ah," *The Institute of Electrical and Electronics Engineers*, doc. No. IEEE 802.11-11/0035r1, (Jan. 2011).

International Preliminary Report on Patentability in corresponding PCT/US2012/023832, dated Aug. 15, 2013.
International Standard, ISO/IEC 8802-11, ANSI/IEEE Std 802.11, "Information technology—Telecommunications and information exchange between systems—local and metropolitan area networks—specific requirements" Part 11: Wireless LAN Medium Access Control (MAC) and Physical Layer (PHY) specifications, *The Institute of Electrical and Electronics Engineers, Inc.*, (1999).
IEEE Std 802.11a-1999 (R2003) (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 GHZ Band," *The Institute of Electrical and Electronics Engineers, Inc.*, (1999) Reaffirmed Jun. 12, 2003.
IEEE Std 802.11b-1999 (Supplement to ANSI/IEEE Std 802.11, 1999 Edition) "Supplement to IEEE Standard for Information technology—Telecommunications and information exchange between systems—Local and metropolitan area networks—Specifc requirements Part 11: Wireless LAN Medium Access Control (MAC) and Physical Layer (PHY) specifications: Higher-speed Physical Layer Extension in the 2.4 GHZ Band," *The Institute of Electrical and Electronics Engineers, Inc.*, 1999.
IEEE Std 802.11b-1999/Cor 1-2001 (Corrigendum to IEEE Std 802.11b-1999) "IEEE Standard for Information technology—Telecommunications and information exchange between systems—Local and metropolitan area networks—Specific requirements, Part 11: Wireless LAN Medium Access Control (MAC) and Physical Layer (PHY) specifications, Amendment 2: Higher-speed Physical Layer (PHY) extension in the 2.4 GHz band—Corrigendum 1," *The Institute of Electrical and Electronics Engineers, Inc.*, 23 pages, Nov. 7, 2001.
IEEE Std 802.11g/D2.8, May 2002 (Supplement to ANSI/IEEE Std 802.11, 1999 Edition) "Draft Supplement to Standard [for] Information technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band," *The Institute of Electrical and Electronics Engineers, Inc.*, May 2002.
IEEE Std P802.11-REVma/06.0, "Unapproved Draft Standard for Information Technology—Telecommunications and information exchange between systems—Local and metropolitan area network—Specific requirements Part 11: Wireless LAN Medium Access Control (MAC) and Physical Layer (PHY) specifications. (This document reflects the combining of the 2003 Edition of 802.11 plus the 802.11 g, 802.11 h, 802.11 i and 802.11j Amendments) (Revision of IEEE Std 802.11-1999) (Superseded by P802.11-REVma_D7.0)," 2006.
IEEE Std 802.11-2007 (revision of IEEE Std. 802.11-1999) "Information Standard for Information technology—Telecommunications and information exchange between systems—Local and metropolitan area networks—Specific requirements" Part 11: Wireless LAN Medium Access Control (MAC) and Physical Layer (PHY) Specifications, *The Institute of Electrical and Electronics Engineers, Inc.*, (Jun. 12, 2007).
Chen, "Home Network Basis: Transmission Environments and Wired/Wireless Protocols," Prentice Hall (Jul. 2003).
Hiertz et al., "The IEEE 802.11 Universe," IEEE Communications Magazine, pp. 62-70, Jan. 2010.
van Nee et al., "The 802.11n MIMO-OFDM Standard for Wireless LAN and Beyond," Wireless Personal Communications, vol. 37, pp. 445-453 (Jun. 2006).
Stacey et al., "Specification Framework for TGac," document No. IEEE 802.11-09/0992r20, *Institute for Electrical and Electronics Engineers*, pp. 1-49, Jan. 18, 2011.
IEEE Std 802.11ac/D2.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, Jan. 2012.

(56) References Cited

OTHER PUBLICATIONS

Perahia, et al., "Gigabit Wireless LANs: an overview of IEEE 802.11ac and 80211ad," ACM SIGMOBILE Mobile Computing and Communications Review, vo. 15, No. 3, pp. 23-33, Jul. 2011.
Syafei et al., "Design of 1.2 Gbps MIMO WLAN System for 4K Digital Cinema Transmission," IEEE 20th Int'l Symposium on Personal, Indoor and Mobile Radio Communications (PIMRC 2009), *The Institute of Electrical and Electronics Engineers*, pp. 207-211 (2009).
Imashioya et al., "RTL Design of 1.2 Gbps MIMO WLAN System and Its Business Aspect," IEEE 9th Int'l Symposium on Communications and Information Technology (ISCIT 2009), *The Institute of Electrical and Electronics Engineers*, pp. 296-301 (2009).
Syafei et al., "A Gigabit MIMO WLAN System with International Standardization Strategy," IEEE Int'l Symposium on Intelligent Signal Processing and Communication Systems (ISPACS 2009), *The Institute of Electrical and Electronics Engineers*, pp. 228-231 (2009).
Shi et al., "Phase Tracking During VHT-LTF," Doc. No. IEEE 802.11-10/0771r0, *The Institute of Electrical and Electronics Engineers, Inc.*, Jul. 2010.
van Zelst et al., "Pilot Sequence for VHT-DATA," Doc. No. IEEE 802.11-10/0811r1, *The Institute of Electrical and Electronics Engineers, Inc.*, Jul. 2010.
IEEE Std P802.11ad/D5.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 3: Enhancements for Very High Throughput in the 60 GHz Band," *The Institute of Electrical and Electronics Engineers, Inc.*, Sep. 2011.
IEEE Std 802.11ad$^{TM}$/D9.0 "Draft Standard for Information technology—Telecommunications and information Exchange Between Systems—Local and Metropolitan Area Networks—Specific Requirements" Part 11: Wireless LAN Medium Access Control (MAC) and Physical Layer (PHY) Specifications, Amendment 3: Enhancements for Very High Throughput in the 60 GHz Band *The Institute of Electrical and Electronics Engineers, Inc.*, (Jul. 2012).
Harada, "Project: IEEE P802.15 Working Group for Wireless Personal Area Network (WPANs)," IEEE 802.15-07-0693-003c (May 2007).
IEEE Std 802.11af/D1.05 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: TV White Spaces Operation," *The Institute of Electrical and Electronics Engineers, Inc.*, Nov. 2011.
Taghavi et al., "Introductory Submission for TGah", doc. No. IEEE 802.11-11/0062r0, *Institute for Electrical and Electronics Engineers*, pp. 1-5 (Jan. 14, 2011).
de Vegt, "Potential Compromise for 802.11ah Use Case Document", Institute of Electrical and Electronics Engineers, doc. No. IEEE 802.11-11/0457r0, (Mar. 2011).
Zhang et al., "11ah Data Transmission Flow," *The Institute of Electrical and Electronics Engineers*, doc. No. IEEE 802.11-11/1484r1, (Nov. 2011).
Vermani, et al. "Preamble Format for 1 MHz," *The Institute of Electrical and Electronics Engineers*, doc. No. IEEE 802.11-11/1482r2, (Nov. 2011).
Vermani, et al. "Spec Framework Text for PHY Numerology," *The Institute of Electrical and Electronics Engineers*, doc. No. IEEE 802.11-11/1311r0, (Sep. 2011).

Non-Final Office action for U.S. Appl. No. 13/366,038, mailed Oct. 23, 2013.
Syafei et al., "A Design of Next Generation Gigabit MIMO Wireless LAN System ," IEEE 12th Int'l Conference on Advanced Communication Technology (ICACT 2010), *The Institute of Electrical and Electronics Engineers*, pp. 941-946 (2010).
IEEE Std 802.11a-1999 (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 GHZ Band," *The Institute of Electrical and Electronics Engineers, Inc.*, (1999).
IEEE Std 802.11b-2001 (Corrigendum to IEEE Std 802.11b-1999) "IEEE Standard for Information technology—Telecommunications and information exchange between systems—Local and metropolitan area networks—Specific requirements, Part 11: Wireless LAN Medium Access Control (MAC) and Physical Layer (PHY) specifications, Amendment 2: Higher-speed Physical Layer (PHY) extension in the 2.4 GHz band—Corrigendum 1," *The Institute of Electrical and Electronics Engineers, Inc.*, Nov. 7, 2001.
IEEE Std 802.11g/D8.2, Apr. 2003 (Supplement to ANSI/IEEE Std 802.11, 1999 (Reaff 2003)) "Draft Supplement to Standard [for] Information technology—Telecommunications and information exchange between systems—Local and metropolitan area networks—Specific requirements, Part 11: Wireless LAN Medium Access Control (MAC) and Physical Layer (PHY) specifications: Further Higher Data Rate Extension in the 2.4 GHz Band," *The Institute of Electrical and Electronics Engineers, Inc.*, Apr. 2003.
Gunnam, et al., "Multi-Rate Layered Decoder Architecture for Block LDPC Codes of the IEEE 802.11n Wireless Standard," IEEE International Symposium on Circuits and Systems, 2007 (ISCAS 2007), pp. 1645-1648 (2007).
Stacey et al., "IEEE P802.11, Wireless LANs, Proposed TGac Draft Amendment," Institute of Electrical and Electronics Engineers, doc. No. IEEE 802.11-10/1361r3 (Jan. 2011).
S. A. Mujtaba, "IEEE P802.11—Wireless LANs, TGn Sync Proposal Technical Specification," *The Institute of Electrical and Electronics Engineers, Inc.*, doc.: IEEE 802.11-04/0889r6, May 2005.
"IEEE P802.11n™/D3.00, Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Higher Throughput," *The Institute of Electrical and Electronics Engineers, Inc.*, Sep. 2007.
"IEEE Std. 802.11n™ IEEE Standard for Information Technology—Telecommunications and information exchange between systems—Local and metropolitan area networks—Specific requirements, Part 11: Wireless LAN Medium Access Control (MAC) and Physical Layer (PHY) Specifications: Amendment 5: Enhancements for Higher Throughput," *The Institute of Electrical and Electronics Engineers, Inc.*, Oct. 2009.
Notice of Allowance in U.S. Appl. No. 14/044,710, dated Mar. 3, 2015 (18 pages).
Notice of Allowance in U.S. Application No. 13/366,038, dated Jul. 7, 2014 (5 pages).
Notice of Allowance in U.S. Appl. No. 13/366,038, dated Mar. 25, 2014 (11 pages).
Park, "Proposed Specification Framework for TGah", *The Institute of Electrical and Electronics Engineers*, doc. no. IEEE 802.11--yy/xxxxr05, (Jan. 2012), pp. 1-12.

\* cited by examiner

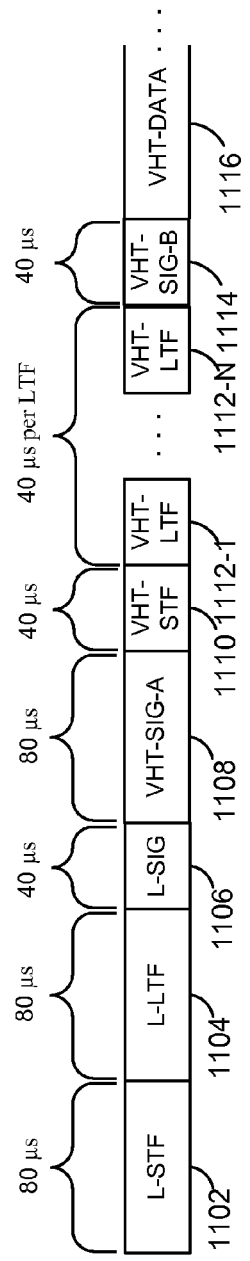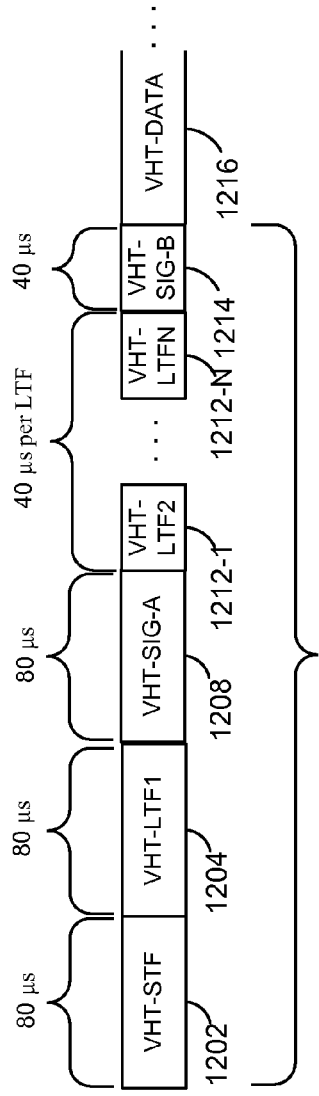
FIG. 11
FIG. 12

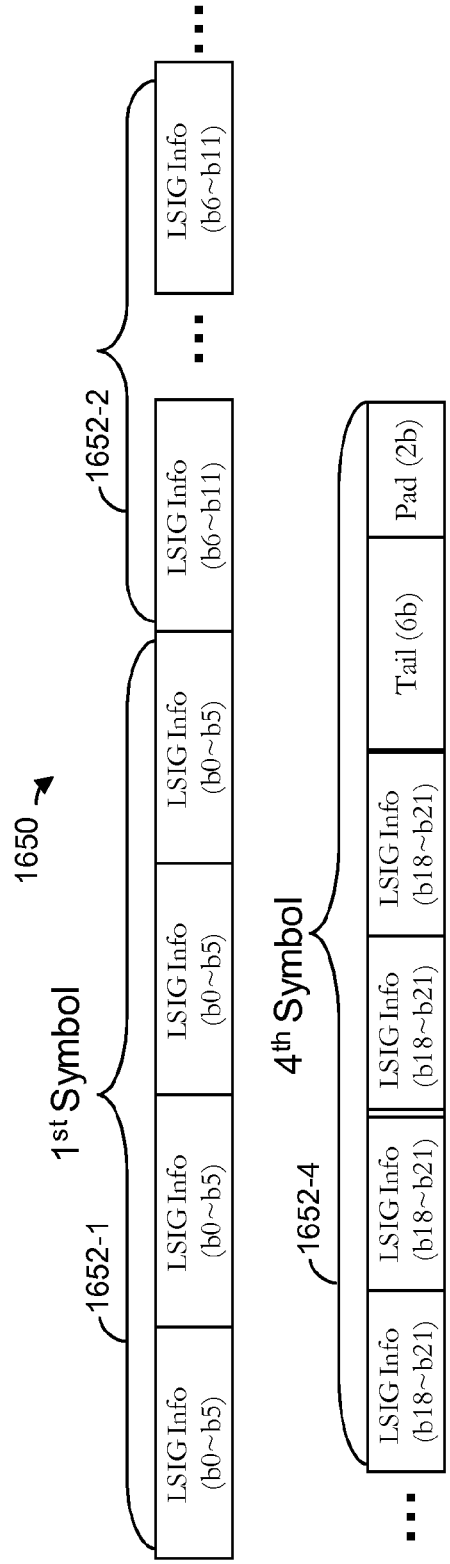

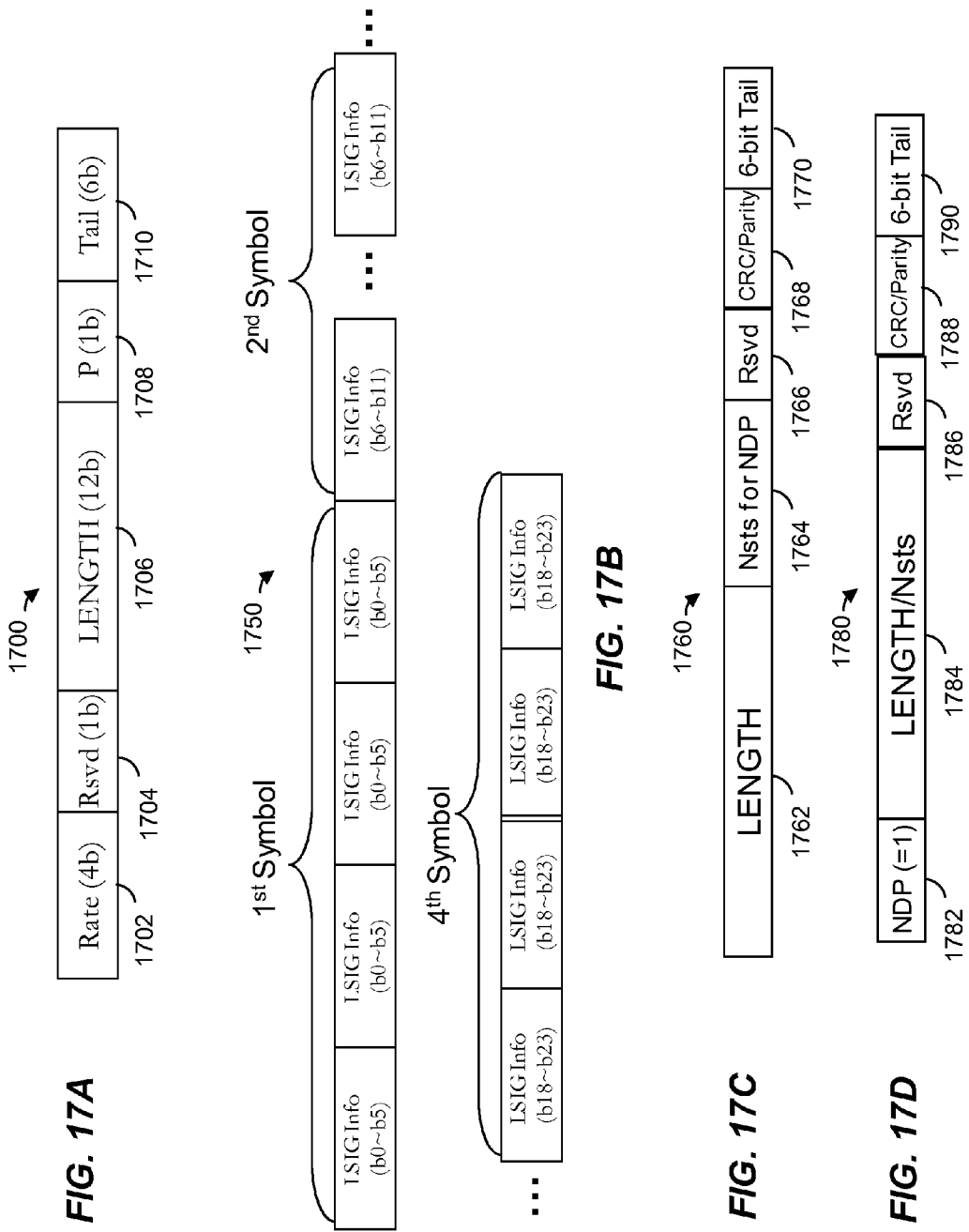

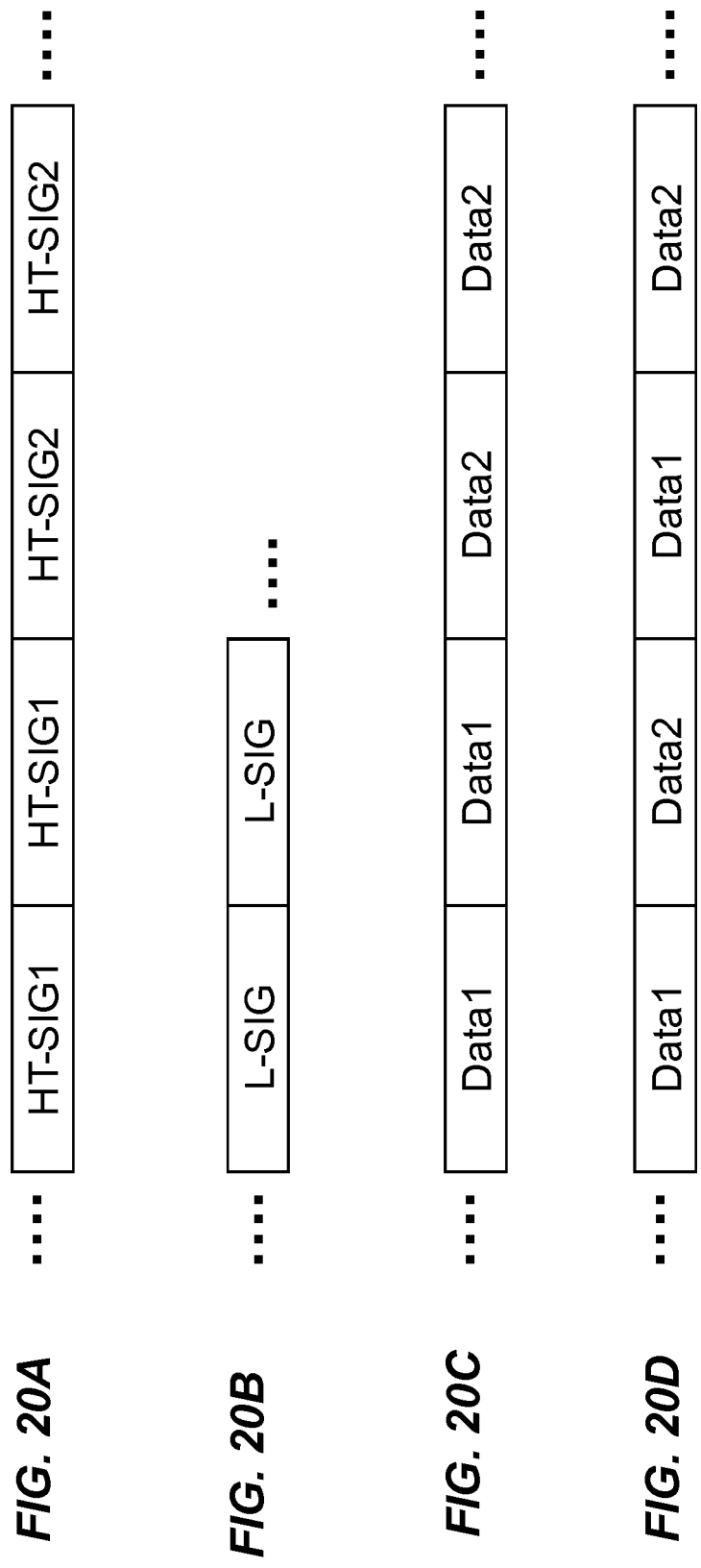

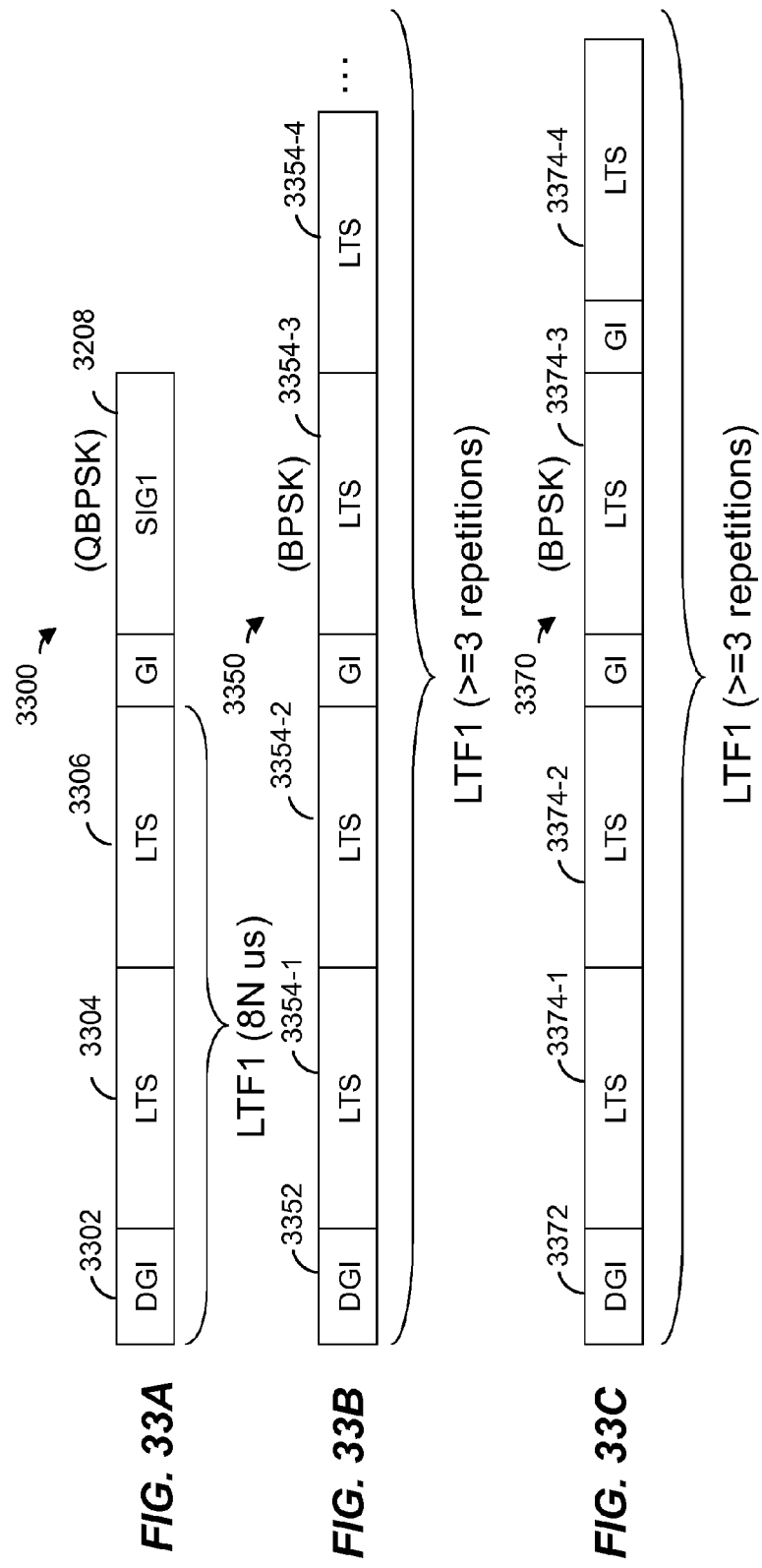

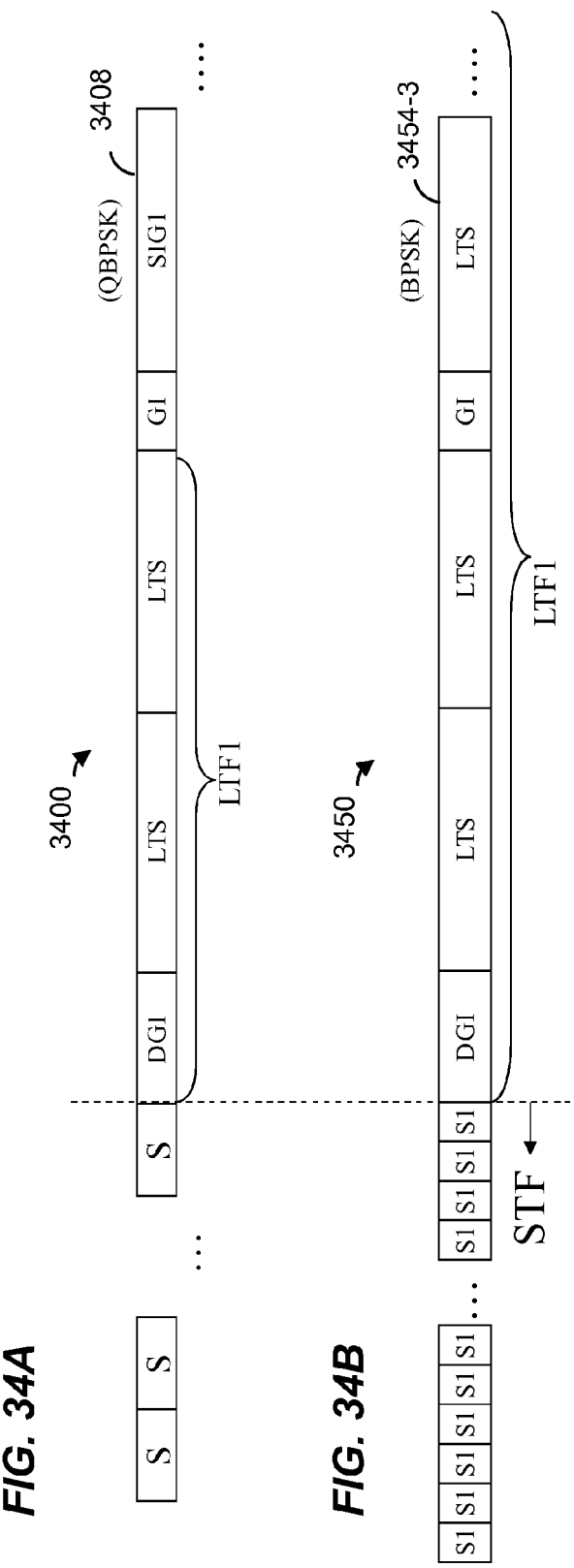

CONTROL MODE PHY FOR WLAN

CROSS-REFERENCES TO RELATED APPLICATIONS

This disclosure claims the benefit of the following U.S. Provisional Patent Applications:
- U.S. Provisional Patent Application No. 61/439,777, entitled "11ah OFDM Low Rate PHY," filed on Feb. 4, 2011;
- U.S. Provisional Patent Application No. 61/440,804, entitled "11ah OFDM Low Rate PHY," filed on Feb. 8, 2011;
- U.S. Provisional Patent Application No. 61/454,444, entitled "11ah OFDM Low Rate PHY," filed on Mar. 18, 2011;
- U.S. Provisional Patent Application No. 61/477,076, entitled "11ah OFDM Low Rate PHY," filed on Apr. 19, 2011;
- U.S. Provisional Patent Application No. 61/480,238, "11ah OFDM Low Rate PHY," filed on Apr. 28, 2011;
- U.S. Provisional Patent Application No. 61/490,447, entitled "11ah OFDM Low Rate PHY," filed on May 26, 2011;
- U.S. Provisional Patent Application No. 61/492,464, entitled "11ah OFDM Low Rate PHY," filed on Jun. 2, 2011;
- U.S. Provisional Patent Application No. 61/499,964, entitled "11ah OFDM Low Rate PHY," filed on Jun. 22, 2011;
- U.S. Provisional Patent Application No. 61/500,505, entitled "11ah OFDM Low Rate PHY," filed on Jun. 23, 2011;
- U.S. Provisional Patent Application No. 61/515,244, entitled "11ah OFDM Low Rate PHY," filed on Aug. 4, 2011; and
- U.S. Provisional Patent Application No. 61/524,263, entitled "11ah OFDM Low Rate PHY," filed on Aug. 16, 2011.

The disclosures of all of the above-referenced patent applications are hereby incorporated by reference herein in their entireties.

The present application is related to U.S. patent application Ser. No. 13/366,038, entitled "Control mode PHY for WLAN," filed on the same day as the present application, and which is hereby incorporated by reference herein in its entirety.

FIELD OF THE DISCLOSURE

The present disclosure relates generally to communication networks and, more particularly, to long range low power wireless local area networks.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

When operating in an infrastructure mode, wireless local area networks (WLANs) typically include an access point (AP) and one or more client stations. WLANs have evolved rapidly over the past decade. Development of WLAN standards such as the Institute for Electrical and Electronics Engineers (IEEE) 802.11a, 802.11b, 802.11g, and 802.11n Standards has improved single-user peak data throughput. For example, the IEEE 802.11b Standard specifies a single-user peak throughput of 11 megabits per second (Mbps), the IEEE 802.11a and 802.11g Standards specify a single-user peak throughput of 54 Mbps, the IEEE 802.11n Standard specifies a single-user peak throughput of 600 Mbps, and the IEEE 802.11ac Standard specifies a single-user peak throughput in the Gbps range.

Work has begun on a two new standards, IEEE 802.11ah and IEEE 802.11af, each of which will specify wireless network operation in sub-1 GHz frequencies. Lowe frequency communication channels are generally characterized by better propagation qualities and extended propagation ranges compared to transmission at higher frequencies. In the past, sub-1 GHz ranges have not been utilized for wireless communication networks because such frequencies were reserved for other applications (e.g., licensed TV frequency bands, radio frequency band, etc.). There are few frequency bands in the sub 1-GHz range that remain unlicensed, with different specific unlicensed frequencies in different geographical regions. The IEEE 802.11ah Standard will specify wireless operation in available unlicensed sub-1 GHz frequency bands. The IEEE 802.11af Standard will specify wireless operation in TV White Space (TVWS), i.e., unused TV channels in sub-1 GHz frequency bands.

SUMMARY

In one embodiment, a method for generating a physical layer (PHY) data unit for transmission via a communication channel includes encoding a plurality of information bits using a forward error correction (FEC) encoder, wherein the information bits are to be included in the PHY data unit. The method also includes mapping the plurality of information bits to a plurality of constellation symbols. The method additionally includes generating a plurality of orthogonal frequency division multiplexing (OFDM) symbols to include the plurality of constellation symbols and generating the PHY data unit to include the plurality of OFDM symbols. The method further includes performing one of: (i) encoding the plurality of information bits according to a block coding scheme, or (ii) encoding the plurality of constellation symbols to according to the block coding scheme.

In another embodiment, an apparatus for generating a PHY data unit for transmission via a communication channel comprises a forward error correction (FEC) encoder to encode a plurality of information bits to be included in the PHY data unit. The apparatus also comprises a constellation mapper to map the plurality of information bits to a plurality of constellation symbols. The apparatus additionally comprises a network interface configured to generate a plurality of orthogonal frequency division multiplexing (OFDM) symbols to include the plurality of constellation symbols; and generate the PHY data unit to include the plurality of OFDM symbols. The network interface is further configured to perform one of: (i) encode the plurality of information bits according to a block coding scheme, or (ii) encode the plurality of constellation symbols to according to the block coding scheme.

BRIEF DESCRIPTION OF THE DRAWINGS

FIG. 11 is a diagram of a normal mode OFDM long range data unit that, according to another embodiment;

FIG. 12 is a diagram of a normal mode OFDM long range data unit that, according to another embodiment;

FIG. 16A is a diagram of an example signal field format, according to an embodiment;

FIG. 16B is a diagram of a block encoded signal field of FIG. 16A, according an embodiment;

FIG. 17A is a diagram of an another example signal field format, according to another embodiment;

FIG. 17B is a diagram of a block encoded signal field of FIG. 17A, according an embodiment;

FIG. 17C is a diagram of an another example signal field format, according to yet another embodiment;

FIG. 17D is a diagram of an another example signal field format, according to still another embodiment;

FIG. 20A is a diagram of a signal field of a control mode data unit, according to an embodiment;

FIG. 20B is a diagram of a signal field of a control mode data unit, according to another embodiment;

FIG. 20C is a diagram of a data portion of a control mode data unit, according to an embodiment;

FIG. 20D is a diagram of a data portion of a control mode data unit, according to another embodiment;

FIGS. 33A-33B are diagrams of a normal mode preamble and a control mode preamble, respectively, according to another embodiment;

FIG. 33C is a diagram of a control mode preamble, according to another embodiment.

FIGS. 34A-34B are diagrams of a control mode preamble and a normal mode preamble, respectively, according to another embodiment;

DETAILED DESCRIPTION

In embodiments described below, a wireless network device such as an access point (AP) of a wireless local area network (WLAN) transmits data streams to one or more client stations. The AP is configured to operate with client stations according to at least a first communication protocol. The first communication protocol defines operation in a sub 1 GH frequency range, and is typically used for applications requiring long range wireless communication with relatively low data rates. The first communication protocol (e.g., IEEE 802.11af or IEEE 802.11ah) is referred to herein as a "long range" communication protocol. In some embodiments, the AP is also configured to communicate with client stations according to one or more other communication protocols which define operation in generally higher frequency ranges and are typically used for closer-range communications with higher data rates. The higher frequency communication protocols (e.g., IEEE 802.11a, IEEE 802.11n, and/or IEEE 802.11ac) are collectively referred to herein as "short range" communication protocols.

In some embodiments, the physical layer (PHY) data units conforming to the long range communication protocol ("long range data units") are the same as or similar to data units conforming to a short range communication protocol ("short range data units"), but are generated using a lower clock rate. To this end, in an embodiment, the AP operates at a clock rate suitable for short range operation, and down-clocking is used to generate a clock to be used for the sub 1 GHz operation. As a result, in this embodiment, a data unit that conforms to the long range communication protocol ("long range data unit") maintains a physical layer format of a data unit that conforms to a short range communication protocol (short range data unit"), but is transmitted over a longer period of time. In addition to this "normal mode" specified by the long range communication protocol, in some embodiments, the long range communication protocol also specifies a "control mode" with a reduced data rate compared to the lowest data rate specified for the normal mode. Because of the lower data rate, the control mode further extends communication range and generally improves receiver sensitivity. In some embodiments, the AP utilizes the control mode in signal beacon or association procedures and/or in transmit beamforming training operations, for example. Additionally or alternatively, the AP utilizes the control mode in situations in which longer range transmission is needed and a lower data rate is acceptable, such as, for example, to communicate with a smart meter or a sensor which periodically transmits small amounts of data (e.g., measurement readings) over a long distance.

Figure 1:
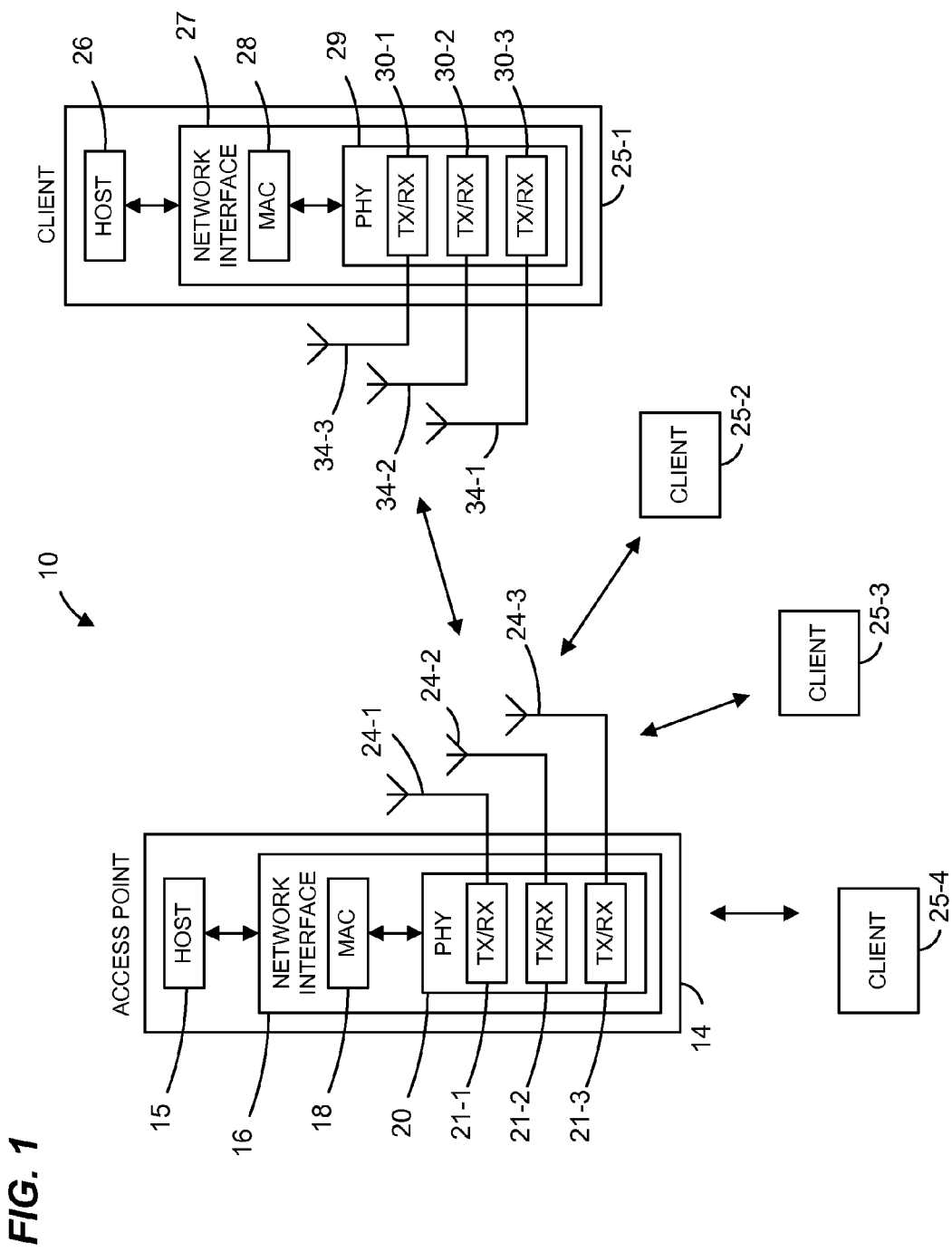
FIG. 1 is a block diagram of an example wireless local area network (WLAN) 10, according to an embodiment.

FIG. 1 is a block diagram of an example wireless local area network (WLAN) 10, according to an embodiment. An AP 14 includes a host processor 15 coupled to a network interface 16. The network interface 16 includes a medium access control (MAC) processing unit 18 and a physical layer (PHY) processing unit 20. The PHY processing unit 20 includes a plurality of transceivers 21, and the transceivers 21 are coupled to a plurality of antennas 24. Although three transceivers 21 and three antennas 24 are illustrated in FIG. 1, the AP 14 can include different numbers (e.g., 1, 2, 4, 5, etc.) of transceivers 21 and antennas 24 in other embodiments.

The WLAN 10 includes a plurality of client stations 25. Although four client stations 25 are illustrated in FIG. 1, the WLAN 10 can include different numbers (e.g., 1, 2, 3, 5, 6, etc.) of client stations 25 in various scenarios and embodiments. At least one of the client stations 25 (e.g., client station 25-1) is configured to operate at least according to the long range communication protocol. In some embodiments, at least one of the client stations 25 (e.g., client station 25-4) is a short range client station that is configured to operate at least according to one or more of the short range communication protocols.

The client station 25-1 includes a host processor 26 coupled to a network interface 27. The network interface 27 includes a MAC processing unit 28 and a PHY processing unit 29. The PHY processing unit 29 includes a plurality of transceivers 30, and the transceivers 30 are coupled to a plurality of antennas 34. Although three transceivers 30 and three antennas 34 are illustrated in FIG. 1, the client station 25-1 can include different numbers (e.g., 1, 2, 4, 5, etc.) of transceivers 30 and antennas 34 in other embodiments.

In an embodiment, one or both of the client stations 25-2 and 25-3, has a structure the same as or similar to the client station 25-1. In an embodiment, the client station 25-4, has a structure similar to the client station 25-1. In these embodiments, the client stations 25 structured the same as or similar to the client station 25-1 have the same or a different number of transceivers and antennas. For example, the client station 25-2 has only two transceivers and two antennas, according to an embodiment.

In various embodiments, the PHY processing unit 20 of the AP 14 is configured to generate data units conforming to the long range communication protocol and having formats described hereinafter. The transceiver(s) 21 is/are configured to transmit the generated data units via the antenna(s) 24. Similarly, the transceiver(s) 24 is/are configured to receive the data units via the antenna(s) 24. The PHY processing unit 20 of the AP 14 is configured to process received data units conforming to the long range communication protocol and having formats described hereinafter, according to various embodiments.

In various embodiments, the PHY processing unit 29 of the client device 25-1 is configured to generate data units conforming to the long range communication protocol and having formats described hereinafter. The transceiver(s) 30 is/are configured to transmit the generated data units via the antenna(s) 34. Similarly, the transceiver(s) 30 is/are configured to receive data units via the antenna(s) 34. The PHY processing unit 29 of the client device 25-1 is configured to process received data units conforming to the long range communication protocol and having formats described hereinafter, according to various embodiments.

In some embodiments, the AP 14 is configured to operate in dual band configurations. In such embodiments, the AP 14 is able to switch between short range and long range modes of operation. According to one such embodiment, when operating in short range mode, the AP 14 transmits and receives data units that conform to one or more of the short range communication protocols. When operating in a long range mode, the AP 14 transmits and receives data units that conform to the long range communication protocol. Similarly, the client station 25-1 is capable of dual frequency band operation, according to some embodiments. In these embodiments, the client station 25-1 is able to switch between short range and long range modes of operation. In other embodiments, the AP 14 and/or the client station 25-1 is dual band device that is able to switch between different low frequency bands defined for long range operations by the long range communication protocol. In yet another embodiment, the AP 14 and/or the client station 25-1 is single band device configured to operate in only one long range frequency band.

Figure 2A:
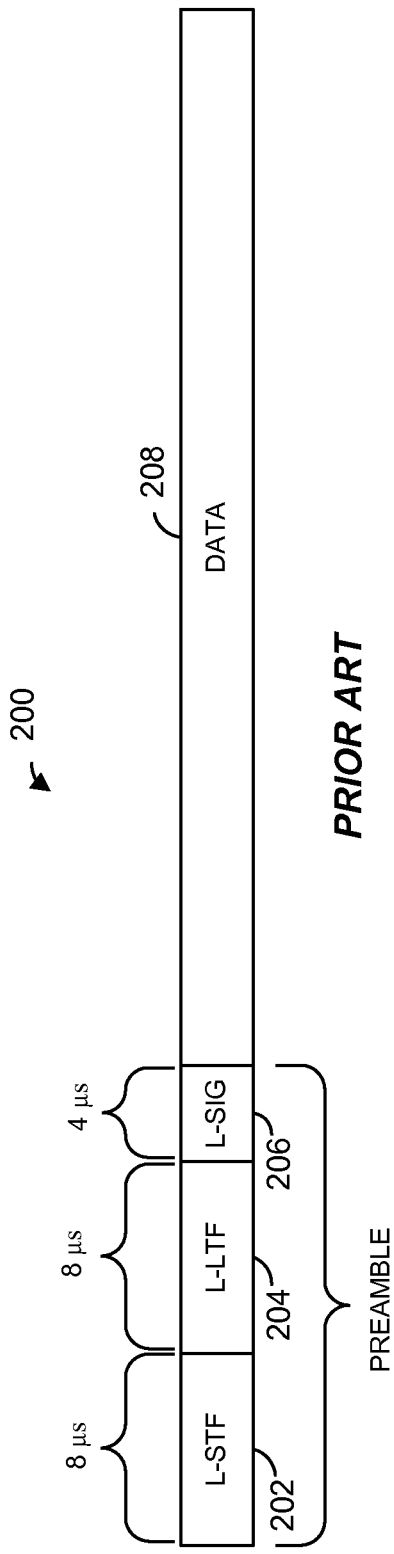
FIGS. 2A and 2B are diagrams of a prior art orthogonal frequency division multiplexing (OFDM) short range data unit.
Figure 2B:
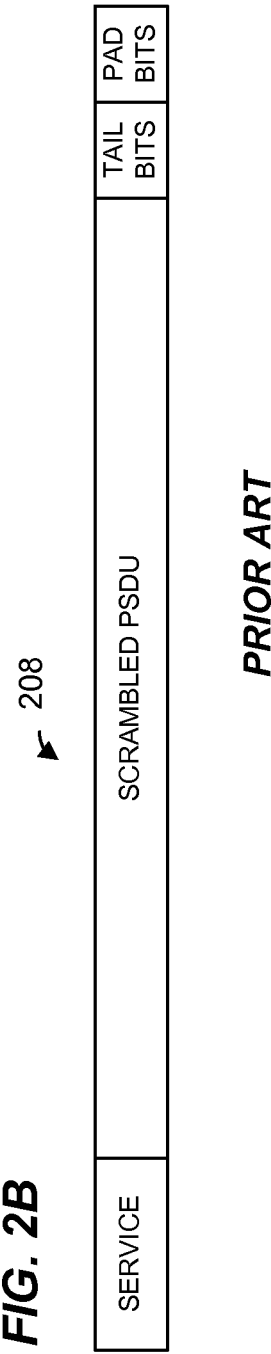

FIG. 2A is a diagram of a prior art OFDM short range data unit 200 that the AP 14 is configured to transmit to the client station 25-4 via orthogonal frequency division multiplexing (OFDM) modulation, according to an embodiment. In an embodiment, the client station 25-4 is also configured to transmit the data unit 200 to the AP 14. The data unit 200 conforms to the IEEE 802.11a Standard and occupies a 20 Megahertz (MHz) band. The data unit 200 includes a preamble having a legacy short training field (L-STF) 202, generally used for packet detection, initial synchronization, and automatic gain control, etc., and a legacy long training field (L-LTF) 204, generally used for channel estimation and fine synchronization. The data unit 200 also includes a legacy signal field (L-SIG) 206, used to carry certain physical layer (PHY) parameters of with the data unit 200, such as modulation type and coding rate used to transmit the data unit, for example. The data unit 200 also includes a data portion 208. FIG. 2B is a diagram of example data portion 208 (not low density parity check encoded), which includes a service field, a scrambled physical layer service data unit (PSDU), tail bits, and padding bits, if needed. The data unit 200 is designed for transmission over one spatial or space-time stream in single input a single output (SISO) channel configuration.

Figure 3:
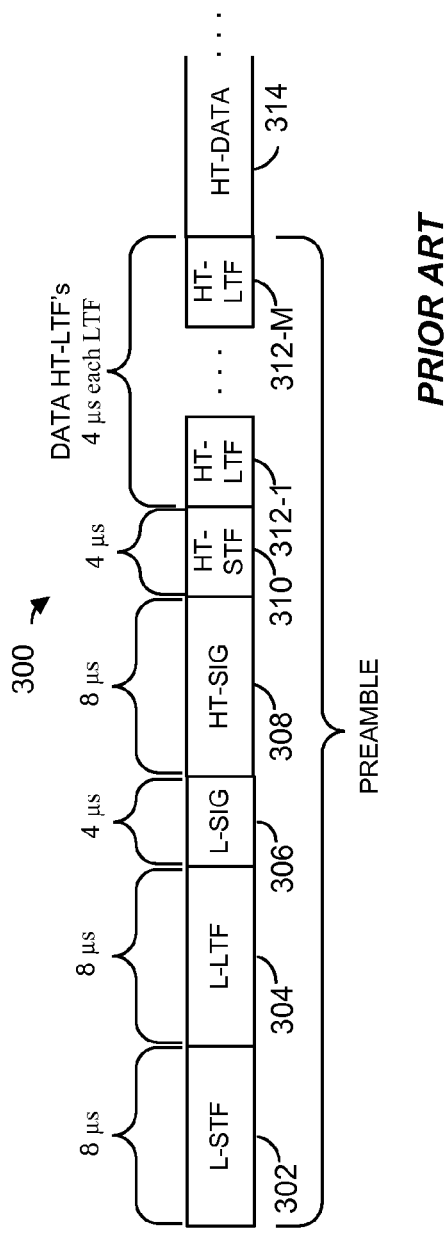
FIG. 3 is a diagram of another prior art OFDM short range data unit.

FIG. 3 is a diagram of a prior art OFDM short range data unit 300 that the AP 14 is configured to transmit to the client station 25-4 via orthogonal frequency domain multiplexing (OFDM) modulation, according to an embodiment. In an embodiment, the client station 25-4 is also configured to transmit the data unit 300 to the AP 14. The data unit 300 conforms to the IEEE 802.11n Standard, occupies a 20 MHz band, and is designed for mixed mode situations, i.e., when the WLAN includes one or more client stations that conform to the IEEE 802.11a Standard but not the IEEE 802.11n Standard. The data unit 300 includes a preamble having an L-STF 302, an L-LTF 304, an L-SIG 306, a high throughput signal field (HT-SIG) 308, a high throughput short training field (HT-STF) 310, and M data high throughput long training fields (HT-LTFs) 312, where M is an integer which generally corresponds to a number of spatial streams used to transmit the data unit 300 in a multiple input multiple output (MIMO) channel configuration. In particular, according to the IEEE 802.11n Standard, the data unit 300 includes two HT-LTFs 312 if the data unit 300 is transmitted using two spatial streams, and four HT-LTFs 312 is the data unit 300 is transmitted using three or four spatial streams. An indication of the particular number of spatial streams being utilized is included in the HT-SIG field 308. The data unit 300 also includes a data portion 314.

Figure 4:
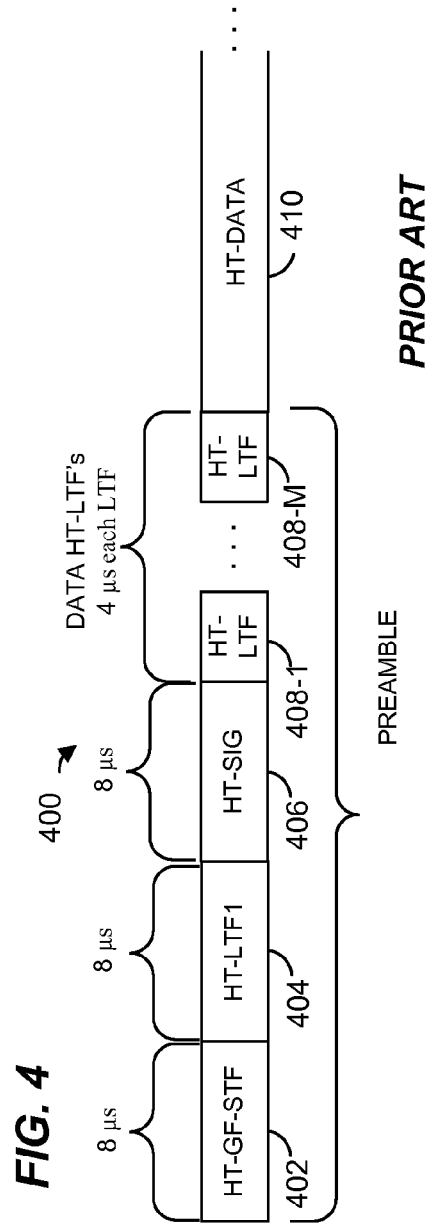
FIG. 4 is a diagram of another OFDM short range data unit.

FIG. 4 is a diagram of a prior art OFDM short range data unit 400 that the AP 14 is configured to transmit to the client station 25-4 via orthogonal frequency domain multiplexing (OFDM) modulation, according to an embodiment. In an embodiment, the client station 25-4 is also configured to transmit the data unit 400 to the AP 14. The data unit 400 conforms to the IEEE 802.11n Standard, occupies a 20 MHz band, and is designed for "Greenfield" situations, i.e., when the WLAN does not include any client stations that conform to the IEEE 802.11a Standard but not the IEEE 802.11n Standard. The data unit 400 includes a preamble having a high throughput Greenfield short training field (HT-GF-STF) 402, a first high throughput long training field (HT-LTF1) 404, a HT-SIG 406, and M data HT-LTFs 408, where M is an integer which generally corresponds to a number of spatial streams used to transmit the data unit 400 in a multiple input multiple output (MIMO) channel configuration. The data unit 400 also includes a data portion 410.

Figure 5:
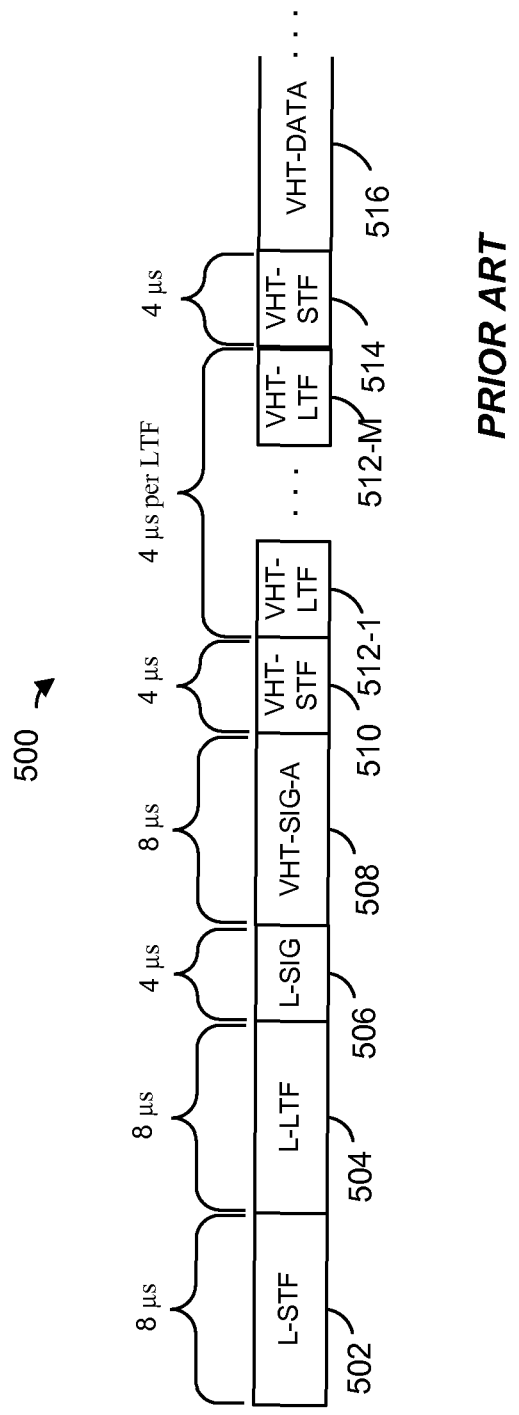
FIG. 5 is a diagram of another prior art OFDM short range data unit.

FIG. 5 is a diagram of a prior art OFDM short range data unit 500 that the client station AP 14 is configured to transmit to the client station 25-4 via orthogonal frequency domain multiplexing (OFDM) modulation, according to an embodiment. In an embodiment, the client station 25-4 is also configured to transmit the data unit 500 to the AP 14. The data unit 500 conforms to the IEEE 802.11ac Standard and is designed for "Mixed field" situations. The data unit 500 occupies a 20 MHz or a 40 MHz bandwidth channel. In other embodiments or scenarios, a data unit similar to the data unit 500 occupies a channel of a different bandwidth, such as an 80 MHz, or a 160 MHz bandwidth channel, for example. The data unit 500 includes a preamble having an L-STF 502, an L-LTF 504, an L-SIG 506, a first very high throughput signal field (VHT-SIG-A) 508, a very high throughput short training field (VHT-STF) 510, M very high throughput long training fields (VHT-LTFs) 512, where M is an integer, and a second very high throughput signal field (VHT-SIG-B) 512. The data unit 500 also includes a data portion 514. In some embodiments, the data unit 500 is a multi-user data unit which carries information to more than one of the client stations 25 simultaneously. In such embodiments or scenarios, the first VHT-SIG-A includes information common to all of the intended client stations, and VHT-SIG-B includes user-specific information for each of the intended client stations.

Figure 6:
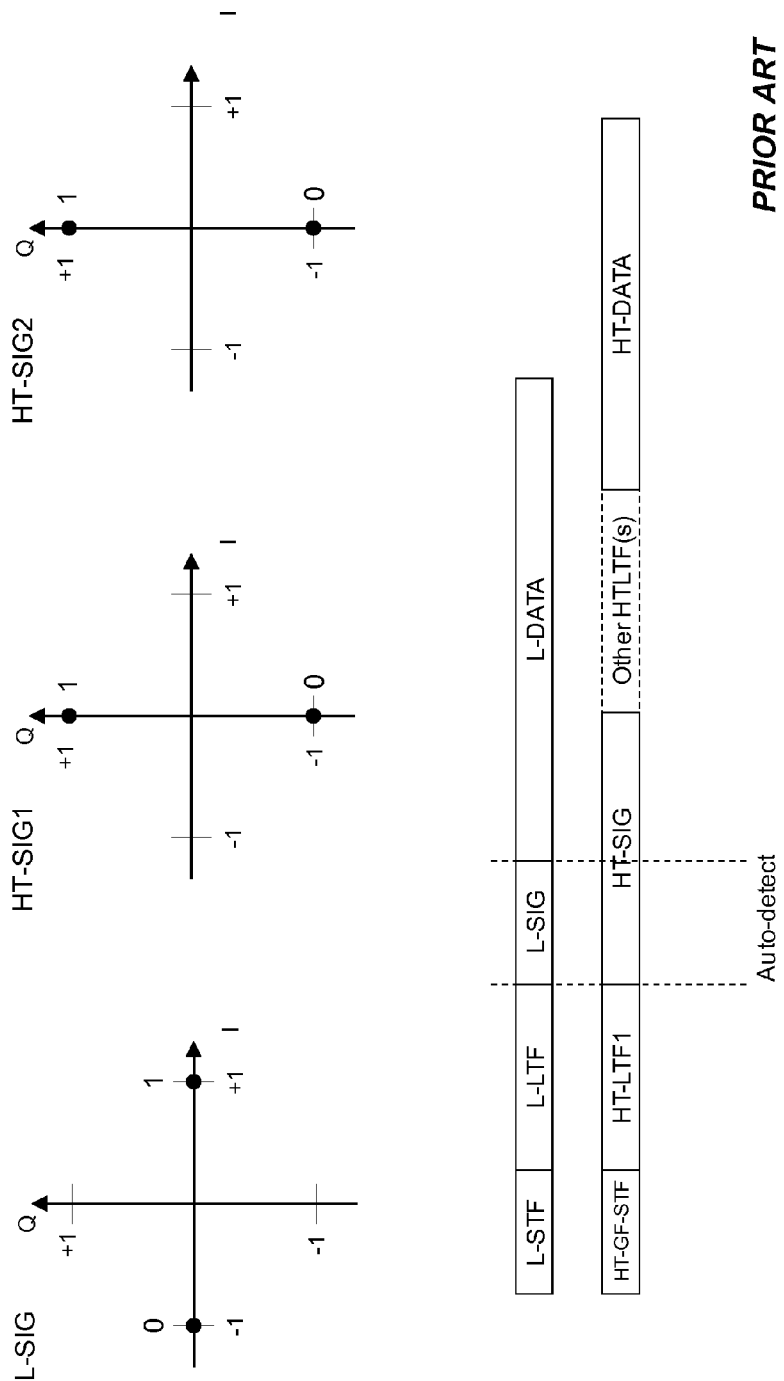
FIG. 6 is a set of diagrams illustrating modulation of various preamble fields as defined by the IEEE 802.11n Standard.

FIG. 6 is a set of diagrams illustrating modulation of the L-SIG, HT-SIG1, and HT-SIG2 fields as defined by the IEEE 802.11n Standard. The L-SIG field is modulated according to binary phase shift keying (BPSK), whereas the HT-SIG1 and HT-SIG2 fields are modulated according to BPSK, but on the quadrature axis (Q-BPSK). In other words, the modulation of the HT-SIG1 and HT-SIG2 fields is rotated by 90 degrees as compared to the modulation of the L-SIG field. As illustrated in FIG. 6, such modulation allows a receiving device to determine or auto-detect, without decoding the entire preamble, that the data unit conforms to the IEEE 802.11n Standard rather than the IEEE 802.11a Standard.

Figure 7:
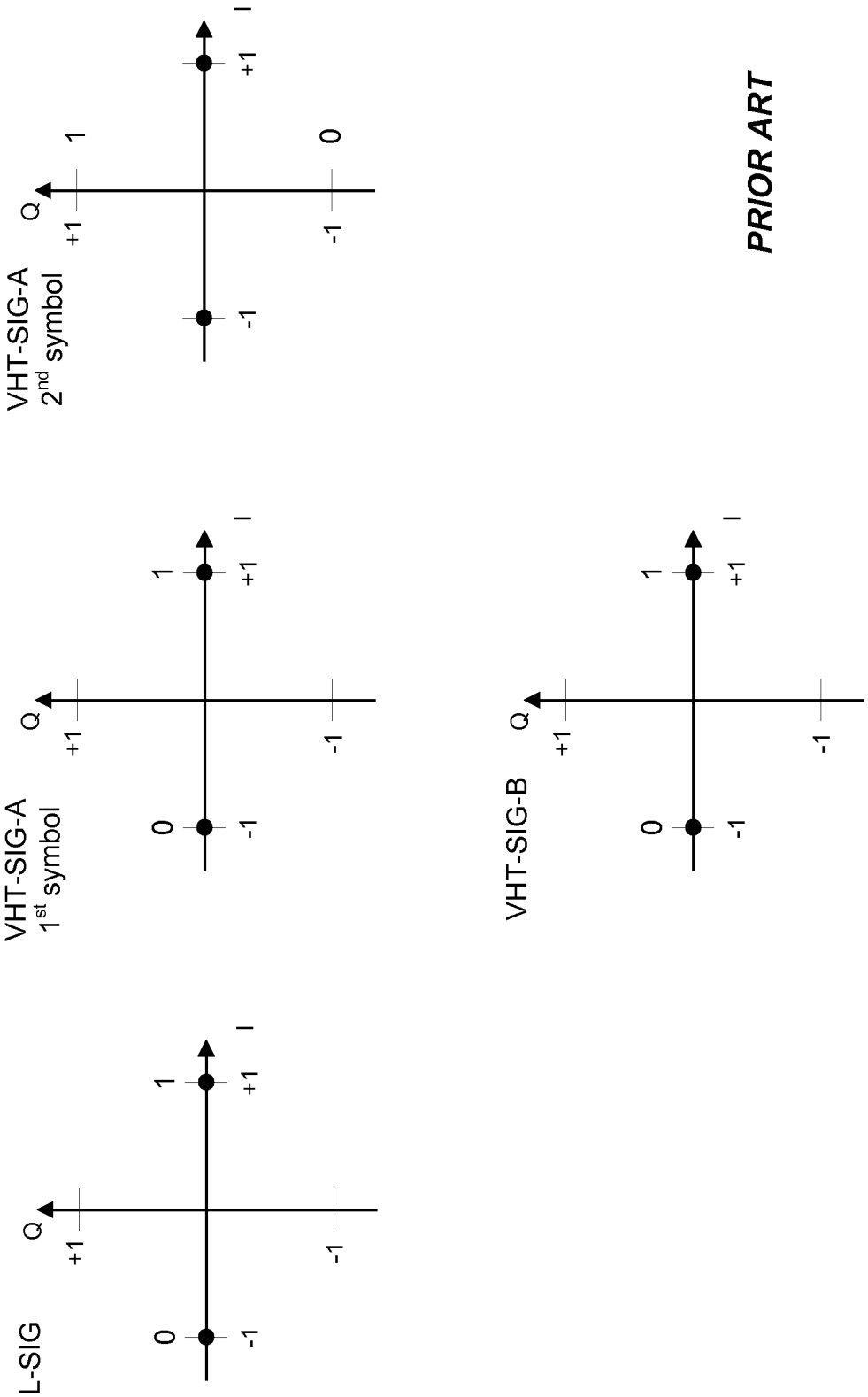
FIG. 7 is a set of diagrams illustrating modulation used to modulate symbols of a prior art data unit.

FIG. 7 is a set of diagrams illustrating modulation of the L-SIG field, the first symbol of the VHT-SIG-A field, the second symbol of the VHT-SIG-A field, and VHT-SIG-B as defined by the IEEE 802.11ac Standard. The L-SIG is modulated according to binary phase shift keying (BPSK). Similarly, first symbol of the VHT-SIGA field is modulated according to BPSK. On the other hand, the second symbol of the VHT-SIG-A field is modulated according to BPSK, but on the quadrature axis (Q-BPSK). The VHT-SIG-B field is modulated according to BPSK, similar to the L-SIG-field and the first symbol of the VHT-SIG-A field. Similar to the 802.11n auto-detect feature discussed above, such modulation allows a receiving device to determine or auto-detect, without decoding the entire preamble, that the data unit conforms to the IEEE 802.11ac Standard rather than either one of the IEEE 802.11a Standard or the IEEE 802.11n Standard.

Figure 8:
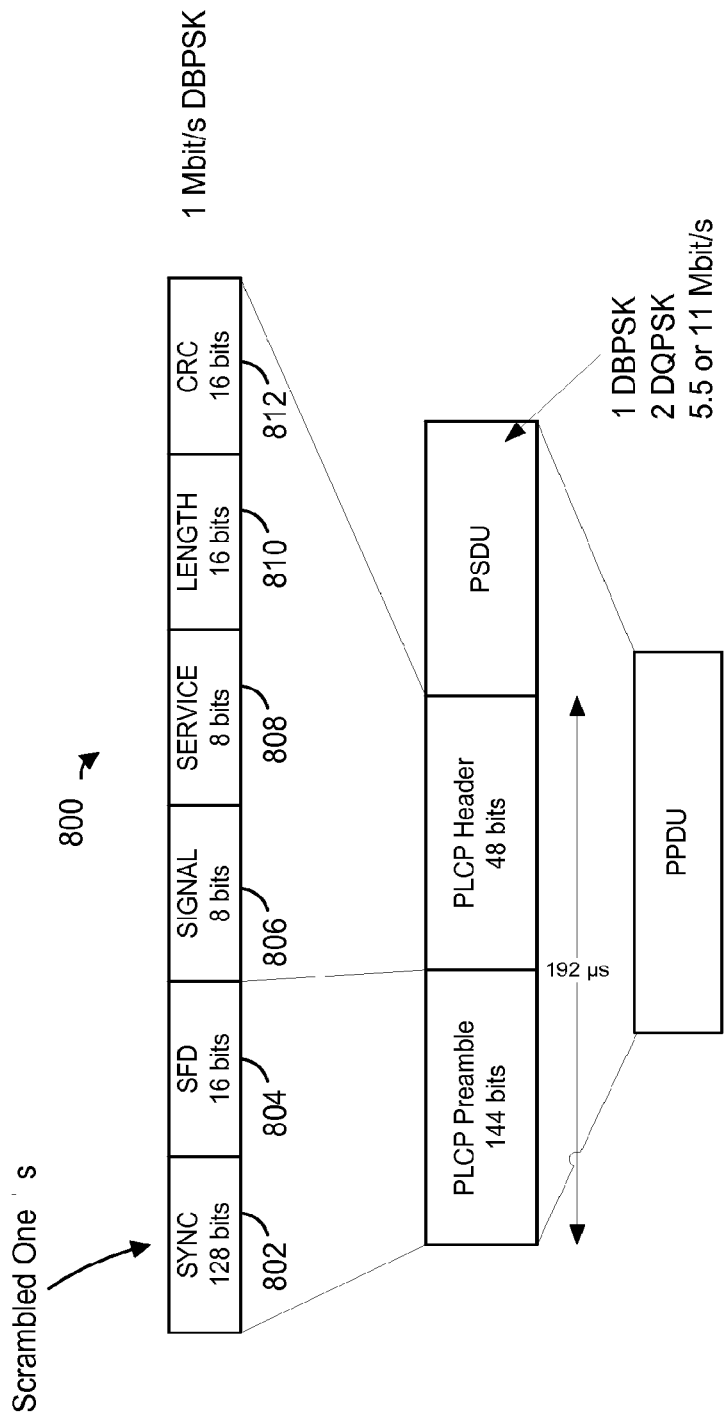
FIG. 8 is a diagram of a prior art single carrier (SC) short range data unit.

FIG. 8 is a diagram of a single carrier (SC) short range data unit 800 that the client station AP 14 configured to transmit to the client station 25-4 via a single carrier channel, according to an embodiment. In an embodiment, the client station 25-4 is also configured to transmit the data unit 800 to the AP 14. The data unit 800 includes a SYNC field 802 that allows a receiver to detect presence of a data unit and begin synchronizing with the incoming signal. The data 800 also includes a start frame delimiter (SFD) field 804 that signals the beginning of a frame. The SYNC field 802 and the SFD field 804 form the preamble portion of the data unit 800. The data unit 800 also includes a header portion having a signal field (SIGNAL) 806, a service field (SERVICE) 808, a length field (LENGTH) 810, and a cyclic check redundancy check field (CRC) 812. The data unit 800 also includes a physical layer service data unit (PSDU), i.e., the data portion 814.

In various embodiments and/or scenarios, data units that conform to a long range communication protocol (e.g., the IEEE 802.11af or 802.11ah Standard) are formatted at least substantially the same as defined by the IEEE 802.11a Standard, the 802.11n Standard (mixed mode or Greenfield), or the 802.11ac Standard, as described and shown above in connection with FIGS. 2-5, but are transmitted at a lower frequency (e.g., sub-1 GHz) and using a slower clock rate. In some such embodiments, a transmitting device (e.g., the AP 14) down-clocks by a factor of N the clock rate used for generating the short range data units, to a lower clock rate to be used for generating the long range data units. The long range data unit is therefore generally transmitted over a longer time, and occupies a smaller bandwidth, than the corresponding short range data unit. The down-clocking factor N is different according to different embodiments and/or scenarios. In one embodiment, the down-clocking factor N is equal to 10. In other embodiments, other suitable down-clocking factor (N) values are utilized, and transmission times and bandwidths of long range data units are scaled accordingly. In some embodiments, the down-clocking factor N is a power of two (e.g., N=8, 16, 32, etc.). In some embodiments, in addition to down-clocked data units, which correspond to the "normal", long range communication protocol also specifies a "control" mode (and a corresponding "control mode" data unit format) with a reduced data rate compared to the lowest data rate specified for the normal mode. Examples of normal mode data units generated using down-clocking, according to some such embodiments, are described blow with reference to FIGS. 9-13 and are also described in U.S. patent application Ser. No. 13/359,336, filed on Jan. 26, 2012, which is hereby incorporated by reference herein in its entirety.

Figure 9:
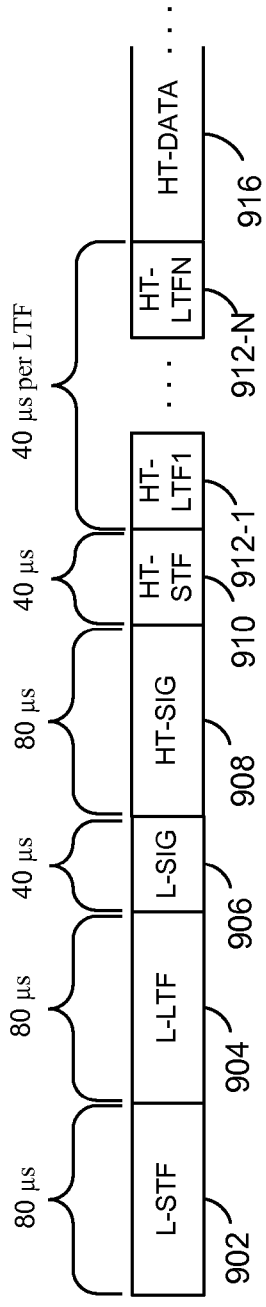
FIG. 9 is a diagram of a normal mode OFDM long range data unit that, according to an embodiment.

FIG. 9 is a diagram of an example normal mode OFDM long range data unit 900 that the AP 14 is configured to transmit to the client station 25-1 via orthogonal frequency domain multiplexing (OFDM) modulation, according to an embodiment. In an embodiment, the client station 25-1 is also configured to transmit the data unit 900 to the AP 14. The data unit 900 is similar to the data unit 500 of FIG. 5 except that the data unit 900 is transmitted using a clock rate that is down-clocked from the short range clock rate by a down-clocking factor N. As a result, symbol duration of each OFDM symbol of the data unit 900 is N times longer compared to symbol duration of an OFDM symbol included in the data unit 500. In the embodiment of FIG. 9, N is equal to 10. Accordingly, each OFDM symbol included in the data unit 900 is 10 times longer compared to an OFDM symbol included in the data unit 500. In other embodiments, other suitable down-clocking factors are utilized.

Figure 10:
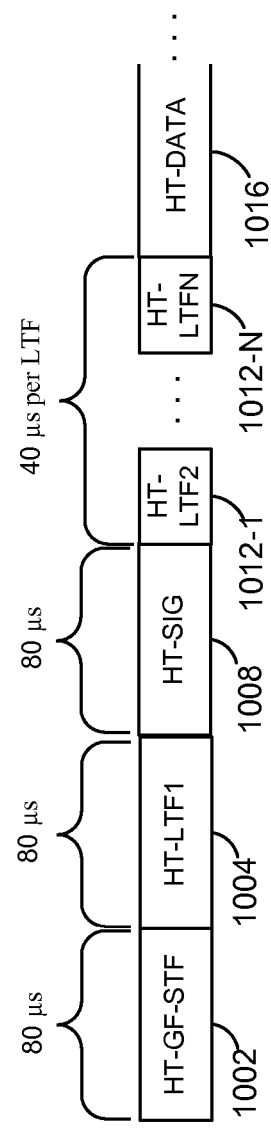
FIG. 10 is a diagram of a normal mode OFDM long range data unit that, according to another embodiment.

FIG. 10 is a diagram of an example normal mode OFDM long range data unit 1000 that the AP 14 is configured to transmit to the client station 25-1 via orthogonal frequency domain multiplexing (OFDM) modulation, according to an embodiment. In an embodiment, the client station 25-1 is also configured to transmit the data unit 1000 to the AP 14. The data unit 1000 is similar to the "green-field" data unit 400 of FIG. 4, except that the data unit 1000 is transmitted using a clock rate that is down-clocked from the short range clock rate by a down-clocking factor N. As a result, symbol duration of each OFDM symbol of the data unit 1000 is N times longer compared to symbol duration of an OFDM symbol included in the data unit 400. In the embodiment of FIG. 10, N is equal to 10. Accordingly, each OFDM symbol included in the data unit 1000 is 10 times longer compared to an OFDM symbol included in the data unit 400. In other embodiments, other suitable down-clocking factors are utilized.

FIG. 11 is a diagram of an example normal mode OFDM long range data unit 1100 that the AP 14 is configured to transmit to the client station 25-1 via orthogonal frequency domain multiplexing (OFDM) modulation when operating in a long range mode, according to an embodiment. In an embodiment, the client station 25-1 is also configured to transmit the data unit 1100 to the AP 14. The data unit 1100 is similar to the data unit 500 of FIG. 5, except that the data unit 1100 is transmitted using a clock rate that is down-clocked from the short range clock rate by a down-clocking factor N. As a result, symbol duration of each OFDM symbol of the data unit 1100 is N times longer compared to symbol duration of an OFDM symbol included in the data unit 500. In the embodiment of FIG. 10, N is equal to 10. Accordingly, each OFDM symbol included in the data unit 1100 is 10 times longer compared to an OFDM symbol included in the data unit 500. In other embodiments, other suitable down-clocking factors are utilized.

FIG. 12 is a diagram of an example normal mode OFDM long range data unit 1200 that the AP 14 is configured to transmit to the client station 25-1 via orthogonal frequency domain multiplexing (OFDM) modulation when operating in a long range mode, according to an embodiment. The data unit 1200 is similar to the data unit 1100 of FIG. 11 except that that the legacy portion of the preamble (i.e., L-STF 1102, L-LTF 1104, L-SIG 1106) is omitted from the data unit 1200. In one embodiment, the VHT-SIG-B field 1214 is omitted from the data unit 1200. Further, bit allocations for some or all fields of the data unit 1200 are different from the bit allocations defined by a short range communication protocol in some embodiments.

Figure 13:
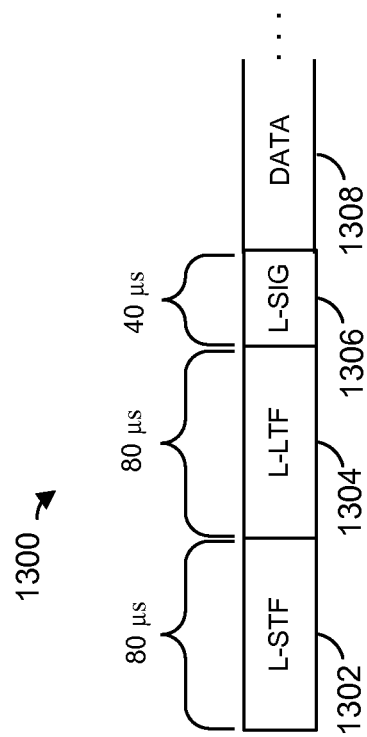
FIG. 13 is a diagram of a normal mode OFDM long range data unit that, according to another embodiment.

FIG. 13 is a diagram of an example normal mode OFDM long range data unit 1300 that the AP 14 is configured to transmit to the client station 25-1 via orthogonal frequency domain multiplexing (OFDM) modulation when operating in a long range mode, according to an embodiment. In an embodiment, the client station 25-1 is also configured to transmit the data unit 1300 to the AP 14. The data unit 1300 is similar to the data unit 200 of FIG. 2, except that the data unit 1300 is transmitted using a clock rate that is down-clocked from the short range clock rate by a down-clocking factor N. As a result, symbol duration of each OFDM symbol of the data unit 1300 is N times longer compared to symbol duration of an OFDM symbol included in the data unit 200. In the embodiment of FIG. 10, N is equal to 10. Accordingly, each OFDM symbol included in the data unit 1300 is 10 times longer compared to an OFDM symbol included in the data unit 200. In other embodiments, other suitable down-clocking factors are utilized.

Figure 14:
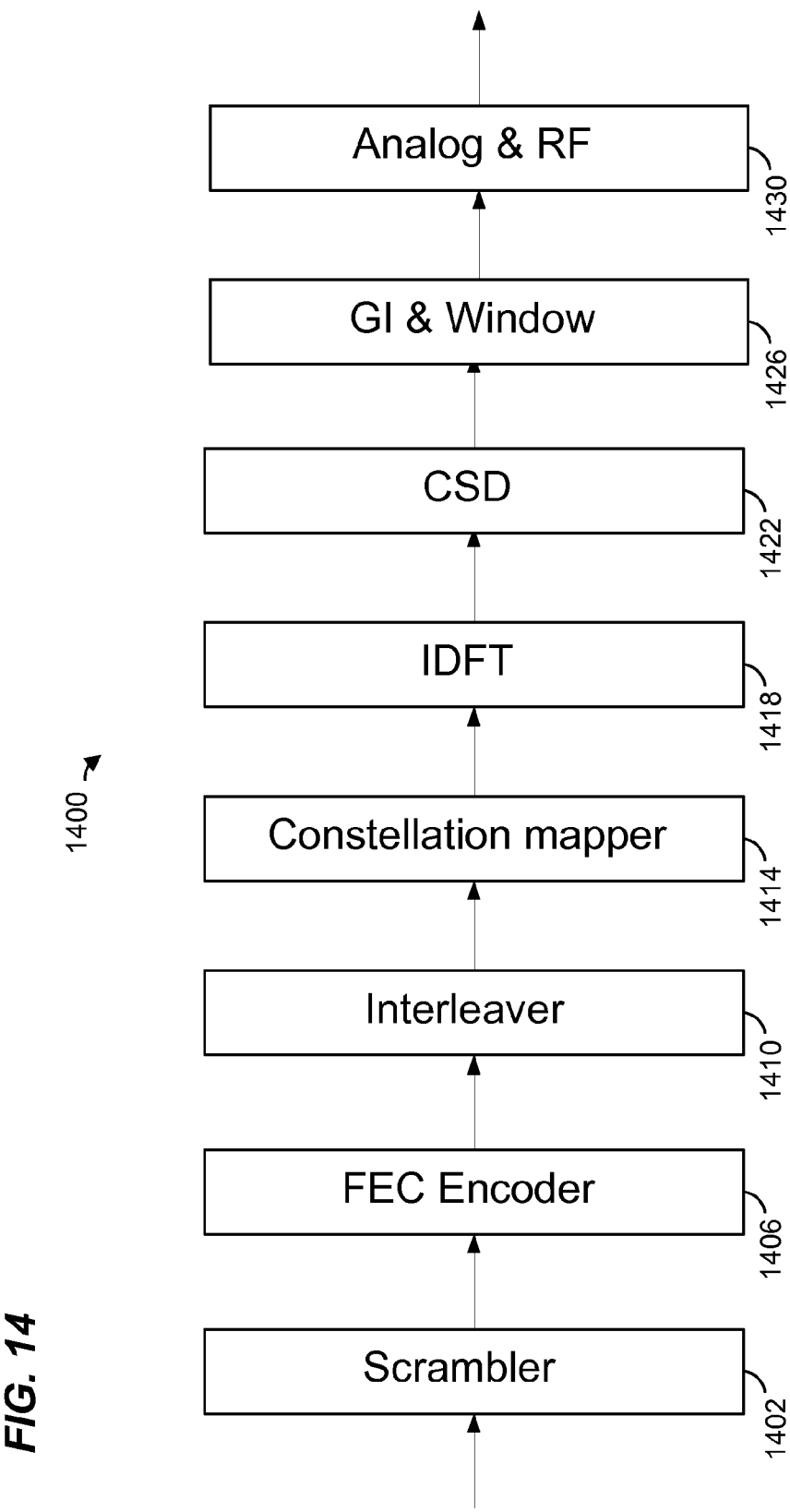
FIG. 14 is a block diagram of an example PHY processing unit for generating normal mode data units, according to an embodiment.

FIG. 14 is a block diagram of an example PHY processing unit 1400 for generating normal mode data units, according to an embodiment. Referring to FIG. 1, the AP 14 and the client station 25-1, in one embodiment, each include a PHY processing unit such as the PHY processing unit 1400. In various embodiments and/or scenarios, the PHY processing unit 1400 generates long range data units such as one of the data units of FIGS. 9-13, for example.

The PHY processing unit 1400 includes a scrambler 1402 that generally scrambles an information bit stream to reduce the occurrence of long sequences of ones or zeros. An FEC encoder 1406 encodes scrambled information bits to generate encoded data bits. In one embodiment, the FEC encoder 1406 includes a binary convolutional code (BCC) encoder. In another embodiment, the FEC encoder 1406 includes a binary convolutional encoder followed by a puncturing block. In yet another embodiment, the FEC encoder 1406 includes a low density parity check (LDPC) encoder. An interleaver 1410 receives the encoded data bits and interleaves the bits (i.e., changes the order of the bits) to prevent long sequences of adjacent noisy bits from entering a decoder at the receiver. A constellation mapper 1414 maps the interleaved sequence of bits to constellation points corresponding to different subcarriers of an OFDM symbol. More specifically, for each spatial stream, the constellation mapper 1414 translates every bit sequence of length $\log_2(M)$ into one of M constellation points.

The output of the constellation mapper 1414 is operated on by an inverse discrete Fourier transform (IDFT) unit 1418 that converts a block of constellation points to a time-domain signal. In embodiments or situations in which the PHY processing unit 1400 operates to generate data units for transmission via multiple spatial streams, the cyclic shift diversity (CSD) unit 1422 inserts a cyclic shift into all but one of the spatial streams to prevent unintentional beamforming. The output of the CSD unit 1422 is provided to the guard interval (GI) insertion and windowing unit 1426 that prepends, to an OFDM symbol, a circular extension of the OFDM symbol and smooths the edges of each symbol to increase spectral decay. The output of the GI insertion and windowing unit 1426 is provided to the analog and radio frequency (RF) unit 1430 that converts the signal to analog signal and upconverts the signal to RF frequency for transmission.

In various embodiments, control mode corresponds to the lowest data rate MCS of the normal mode and introduces redundancy or repetition of bits into at least some fields of the data unit to further reduce the data rate. For example, control mode introduces redundancy into the data portion and/or the signal field of a control mode data unit according to one or more repetition and coding schemes described below, in various embodiments and/or scenarios. As an example, according to an embodiment, data units in normal mode are generated according a particular modulation and coding scheme (MCS), e.g., and MCS selected from a set of MCSs, such as MCS0 (binary phase shift keying (BPSK) modulation and coding rate of 1/2) to MCS9 (quadrature amplitude modulation (QAM) and coding rate of 5/6), with higher order MCSs corresponding to higher data rates. Control mode data units, in one such embodiment, are generated using modulation and coding as defined by MCS0 and with added bit repletion or block encoding that further reduce the data rate.

Figure 15A:
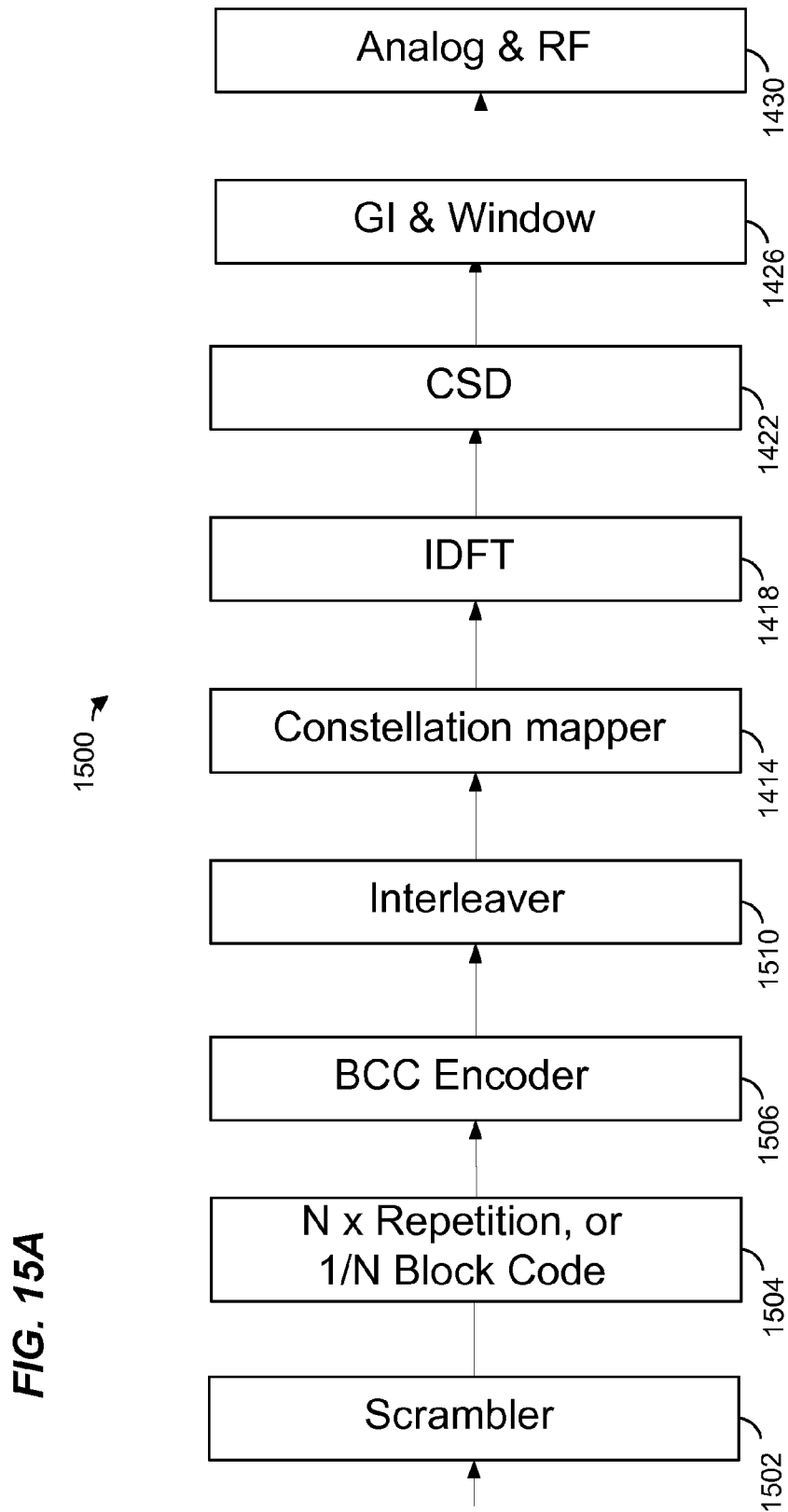
FIG. 15A is a block diagram of an example PHY processing unit for generating control mode data units, according to an embodiment.

FIG. 15A is a block diagram of an example PHY processing unit 1500 for generating control mode data units, according to an embodiment. In some embodiments, the PHY processing unit 1500 generates signal and/or data fields of control mode data units. Referring to FIG. 1, the AP 14 and the client station 25-1, in one embodiment, each include a PHY processing unit such as the PHY processing unit 1500.

The PHY processing unit 1500 is similar to the PHY processing unit 1400 of FIG. 14 except that the PHY processing unit 1500 includes a block coding unit 1504 coupled to the scrambler 1502. In an embodiment, the block coding unit 1504 reads incoming (scrambled) information bits one block at a time, generates a number of copies of each block (or each bit in a block), interleaves the resulting bits according to a coding scheme and outputs the interleaved bits for further encoding by the BCC encoder 1506. Generally, each block contains the number of information bits that, after having been encoded by the block coding unit 1504 and by the BCC encoder 1506, fill the data tones of a single OFDM symbol, according to an embodiment. As an example, in one embodiment, the block coding unit 1504 generates two copies (2× repetition) of each block of 12 information bits to generate 24 bits to be included in an OFDM symbol. The 24 bits are then encoded by the BCC encoder 1506 at the coding rate of 1/2 to generate 48 bits that modulate 48 data tones of an OFDM symbol (e.g., using BPSK modulation). As another example, in another embodiment, the block coding unit 1504 generates four copies (4× repetition) of each block of 6 information bits to generate 24 bits which are then encoded by the BCC encoder 1506 at the coding rate of 1/2 to generate 48 bits that modulate 48 data tones of an OFDM symbol. As yet another example, in another embodiment, the block coding unit 1504 generates two copies (2× repetition) of each block of 13 information bits to generate 26 bits which are then encoded by the BCC encoder 1506 at the coding rate of 1/2 to generate 52 bits that modulate 52 data tones of an OFDM symbol.

In some embodiments, the block coding unit 1504 applies a 4× repetition scheme when generating a data (or a signal) field as defined by MCS0 as specified in the IEEE 802.11n Standard for 20 MHz channel, i.e. with 52 data tones per OFDM symbol. In this case, according to an embodiment, the block coding unit 1504 generates four copies of each block of 6 information bits to generate 24 bits and then adds two padding bits (i.e., two bits of a predetermined values) to provide the specified number of bits (i.e., 26 bits for 52 data tones) to the BCC encoder which encoded the 26 bits using the coding rate of 1/2 to generate 52 coded bits for modulating the 52 data tones.

In one embodiment, the block coding unit 1504 utilizes a "block level" repetition scheme in which each block of n bits is repeated m consecutive times. As an example, if m is equal to 4 (4× repetitions), the block coding unit 1504 generates a sequence [C, C, C, C], where C is a block of n bits, according to an embodiment. In another embodiment, the block coding unit 1504 utilizes a "bit level" repetition scheme in which each incoming bit is repeated m consecutive times. In this case, in an embodiment, if m is equal to 4 (4× repetitions), the block coding unit 1504 generates the sequence [b1 b1 b1 b1 b2 b2 b2 b2 b3 b3 b3 b3 . . . ], where b1 is the first bit in the block of bits, b2 is the second bit, and so on. In yet another embodiment, the block coding unit 1504 generates m number of copies of the incoming bits and interleaves the resulting bit stream according to any suitable code. Alternatively, in still another embodiment, the block coding unit 1504 encodes incoming bits or incoming blocks of bits using any suitable code, e.g., a Hamming block code with the coding rate of a 1/2, 1/4, etc., or any other block code with the coding rate of 1/2, 1/4, etc. (e.g., (1,2) or (1, 4) block code, (12,24) block code or (6, 24) block code, a (13,26) block code, etc.).

According to an embodiment, the effective coding rate corresponding to a combination of the coding performed by the block coding unit 1504 and coding performed by the BCC encoder 1506 the product of the two coding rates. For example, in an embodiment in which the block coding unit 1504 utilizes 4× repetition (or coding rate of 1/4) and the BCC encoder 1506 utilizes a coding rate of 1/2, the resulting effective coding rate is equal to 1/8. As a result of the reduced coding rate compared to the coding rate used to generate a similar normal mode data unit, data rate in control mode is effectively reduced by a factor corresponding to the number the coding rate applied by the block coding unit 1504 (e.g., a factor of 2, a factor of 4, etc.), according to an embodiment.

According to some embodiments, the block coding unit 1504 utilizes the same block coding scheme for generating the signal field of a control mode data unit as the block coding scheme used for generating the data portion of the control mode data unit. For instance, in an embodiment, an OFDM symbol of the signal field and an OFDM symbol of the data portion each includes 48 data tones, and in this embodiment, the block coding unit 1504 applies a 2× repetition scheme to blocks of 12 bits for the signal field and the data portion, for example. In another embodiment, the data portion and the signal field of a control mode data unit are generated using different block coding schemes. For example, in an embodiment, the long range communication protocol specifies a different number of data tones per OFDM symbol in the signal field compared to the number of data tones per OFDM symbol in the data portion. Accordingly, in this embodiment, the block coding unit 1504 utilizes a different block size and, in some embodiments, a different coding scheme, when operating on the signal field compared to the block size and the coding scheme used for generating the data portion. For example, if the long range communication protocol specifies 52 data tones per OFDM symbol of the signal field and 48 data tones per OFDM tones of the data portion, the block coding unit 1504 applies a 2× repetition scheme to blocks of 13 bits of the signal field and a 2× repetition scheme to blocks of 12 bits of the data portion, according to one embodiment.

The BCC encoder 1506 encodes the block coded information bits, according to an embodiment. In an embodiment, BCC encoding is performed continuously over the entire field being generated (e.g., the entire data field, the entire signal field, etc.). Accordingly, in this embodiment, information bits corresponding to the field being generated are partitioned into blocks of a specified size (e.g., 6 bits, 12 bits, 13 bits, or any other suitable number of bits), each block is processed by the block coding unit 1504, and the resulting data stream is then provided to the BCC encoder 1506 which continuously encodes the incoming bits.

Similar to the interleaver 1410 of FIG. 14, in various embodiments, the interleaver 1510 changes the order of bits in order to provide diversity gain and reduce the chance that consecutive bits in a data stream will become corrupted in the transmission channel. In some embodiments, however, the block coding unit 1504 provides sufficient diversity gain and the interleaver 1510 is omitted.

In some embodiments, information bits in the data portion of a control mode data unit are be padded (i.e., a number of bits of a known value is added to the information bits) so that the data unit occupies an integer number of OFDM symbols, for example. Referring to FIG. 1, in some embodiments, padding is implemented in the MAC processing unit 18, 28 and/or the PHY processing unit 20, 29. In some such embodiments, the number of padding bits is determined according to padding equations provided in a short range communication protocol (e.g., the IEEE 802.11a Standard, the IEEE 802.11n Standard, the IEEE 802.11ac Standard, etc.). In general, these padding equations involve computing a number of padding bits based, in part, on a number of data bits per OFDM symbol ($N_{DBPS}$) and/or a number coded data bits per symbol ($N_{CBPS}$). In control mode, according to an embodiment, the number of padding bits is determined based on the number of information bits in an OFDM symbol (e.g., 6 bits, 12 bits, 13 bits, etc.) before the information bits are block encoded by the block coding unit 1504 and BCC encoded by the BCC encoder 1506. Accordingly, the number of padding bits in a control mode data unit is generally different from the number of padding bits in the corresponding normal mode data (or in the corresponding short range data unit). On the other hand, according to an embodiment, the number of coded bits per symbol is the same as the number of coded bits per symbol in normal mode data unit (or in the corresponding short range data unit), e.g., 24, 48, 52, etc. coded bits per OFDM.

Figure 15B:
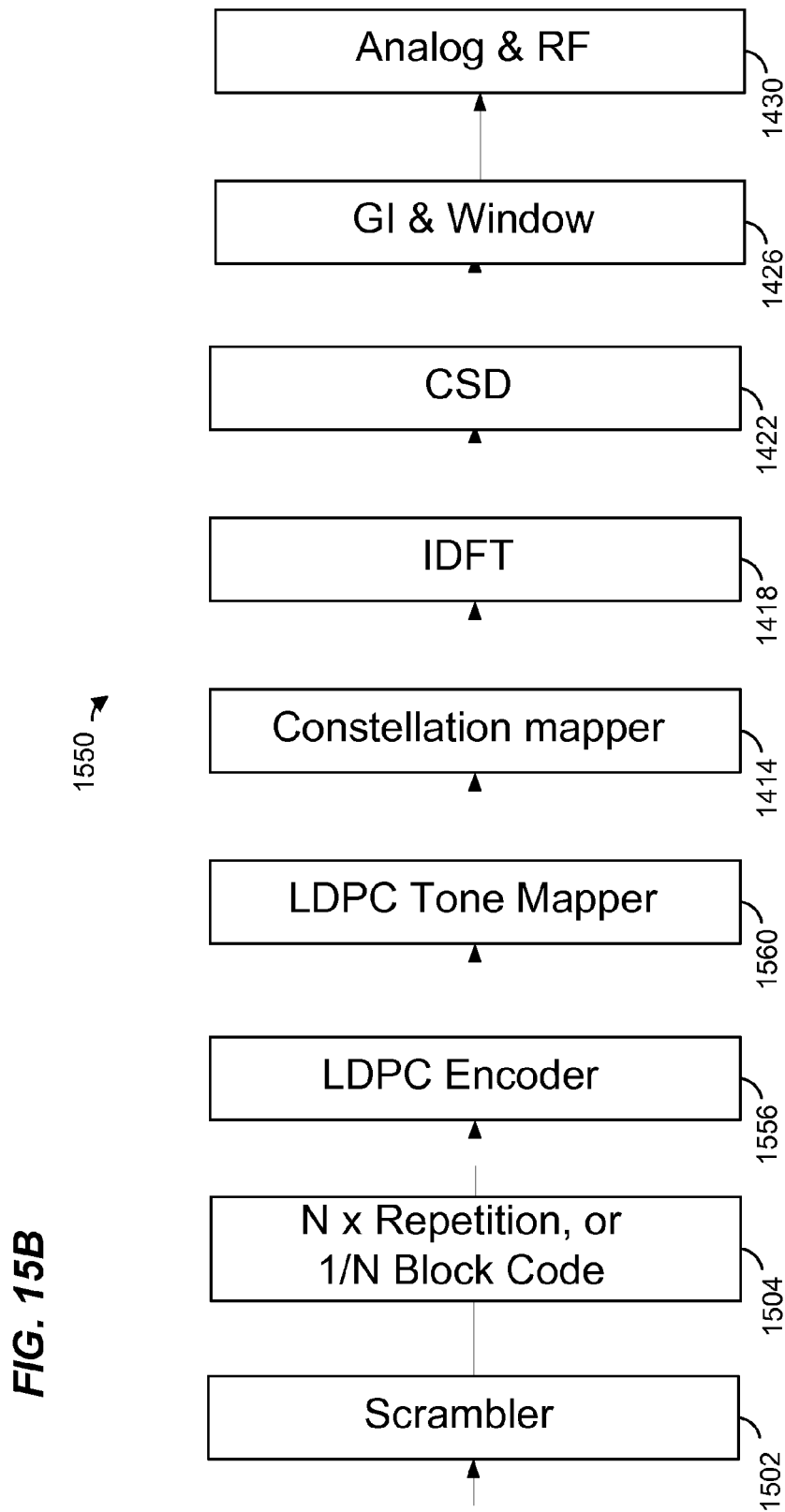
FIG. 15B is a block diagram of an example PHY processing unit for generating control mode data units, according to another embodiment.

FIG. 15B is a block diagram of an example PHY processing unit 1550 for generating control mode data units, according to another embodiment. In some embodiments, the PHY processing unit 1550 generates signal and/or data fields of control mode data units. Referring to FIG. 1, the AP 14 and the client station 25-1, in one embodiment, each include a PHY processing unit such as the PHY processing unit 1550.

The PHY processing unit 1550 is similar to the PHY processing unit 1500 of FIG. 15, except that in the PHY processing unit 1550, the BCC encoder 1506 is replaced by the LDPC encoder 1556. Accordingly, in this embodiment, the output of the block coding unit 1504 is provided for further block encoding by the LDPC encoder 1556. In an embodiment, the LDPC encoder 1556 utilizes a block code corresponding to a coding rate of 1/2, or a block code corresponding to another suitable coding rate. In the illustrated embodiment, the PHY processing unit 1550 omits the interleaver 1510 because adjacent bits in an information stream are generally spread out by the LDPC code itself and no further interleaving is needed.

Additionally, in an embodiment, further frequency diversity is provided by the LDPC tone remapping unit 1560. According to an embodiment, the LDPC tone remapping unit 1560 reorders coded information bits or blocks of coded information bits according to a tone remapping function. The tone remapping function is generally defined such that consecutive coded information bits or blocks of information bits are mapped onto nonconsecutive tones in the OFDM symbol to facilitate data recovery at the receiver in cases in which consecutive OFDM tones are adversely affected during transmission. In some embodiments, the LDPC tone remapping unit 1560 is omitted. Referring again to FIG. 15A, in various embodiments, a number of tail bits are typically added to each field of a data unit for proper operation of the BCC encoder 1506, e.g., to ensure that the BCC encoder, after having encoded each field, is brought back to zero state. In one embodiment, for example, six tail bits are inserted at the end of the data portion before the data portion is provided to the BCC encoder 1506 (e.g., after the bits are processed by the block coding unit 1504).

Similarly, in the case of a signal field, tail bits are inserted into the signal field before the signal field is provided to the BCC encoder 1506, in various embodiments. FIG. 16A is a diagram of an example signal field 1600, according to an embodiment. The signal field 1600 includes a four bit rate subfield 1604, a twelve bit length subfield 1604 and one bit parity bit 1606. The signal field 1600 also includes a five bit reserved subfield 1608. In this embodiment, bit allocation of the signal field 1600 does not include bits allocated for tail bits. FIG. 16B is a diagram of a block encoded signal field 1650, according an embodiment. In an embodiment, the block coding unit 1504 of FIG. 15 generates the signal field 1650 by encoding the signal field 1600 of FIG. 16A. The block coded signal field 1650 includes four OFDM symbols 1652, wherein each OFDM symbol 1652 includes four repetitions of a block of six bits of the signal field 1600. As illustrated, six tail bits and two padding bits are added at the end of the last OFDM of the block encoded signal field (OFDM symbol 1652-4).

Alternatively, tail bits are inserted into a signal field before the signal field is block encoded, in another embodiment. Accordingly, in this case, the inserted tail bits are repeated or otherwise encoded (e.g., by the block coding unit 1504 of FIG. 15). FIG. 17A is a diagram of a signal field 1700 in which six tail bits are inserted at the end of the signal field before block encoding, according to an embodiment. Signal field 1700 includes a four bit rate subfield 1702, a one bit reserved subfield 1704, a twelve bit length subfield 1706, followed by one parity bit (1708) and six tail bits (1710). FIG. 17B is a diagram of a block encoded signal field 1750, according an embodiment. In an embodiment, the block coding unit 1504 of FIG. 15 generates the signal field 1750 by encoding the signal field 1700 of FIG. 17A. As in the example of the block coded signal field 1650 of FIG. 16, the signal field 1750 includes four OFDM symbols. In this embodiment, however, the block coded signal field 1750 includes multiple repetitions (four repetitions, in this case) of the tail bits.

In some embodiments, the signal field of a control mode data unit has a different format compared to the signal field format of a normal mode data unit. In some such embodiment, the signal field of control mode data units is shorter compared to a signal field of a normal mode data unit. For example, only one modulation and coding scheme is used in control mode, according to an embodiment, and therefore less information (or no information) regarding modulation and coding needs to be communicated in the control mode signal field. Similarly, in an embodiment, maximum length of a control mode data unit is shorter compared to a maximum length of a normal mode data unit and, in this case, less bits are needed for the length subfield of the control mode signal field. As an example, in one embodiment, a control mode signal field is formatted according to the IEEE 802.11n Standard but omits certain subfields (e.g., the low density parity check (LDPC) subfield, the space time block coding (STBC) subfield, etc.). Additionally or alternatively, in some embodiments, a control mode signal field includes a shorter CRC subfield compared to the cyclic redundancy check (CRC) subfield of a normal mode signal field (e.g., less than 8 bits). In general, in control mode, certain signal field subfields are omitted or modified and/or certain new information is added, according to some embodiments.

FIG. 17C is diagram of a control mode signal field 1760, according to one such embodiment. The control mode signal field 1760 is similar to the signal field 1700 of FIG. 17A, but the rate subfield is omitted from the signal field 1760 (e.g., because only one rate is specified for control mode). Additionally, the signal field 1760 includes a number of space time streams (Nsts) subfield 1764 for signaling null data packets in a channel sounding procedure, for example.

FIG. 17D is diagram of a control mode signal field 1770, according to another embodiment. The signal field 1770 is similar to the signal field 1700 of FIG. 17A, but omits a rate field, includes a null data packet field (NDP) 1772 for signaling null data packets in a channel sounding procedure, for example. The signal field 1770 also includes an indication of the number of space time streams in the length field 1774.

Figure 18A:
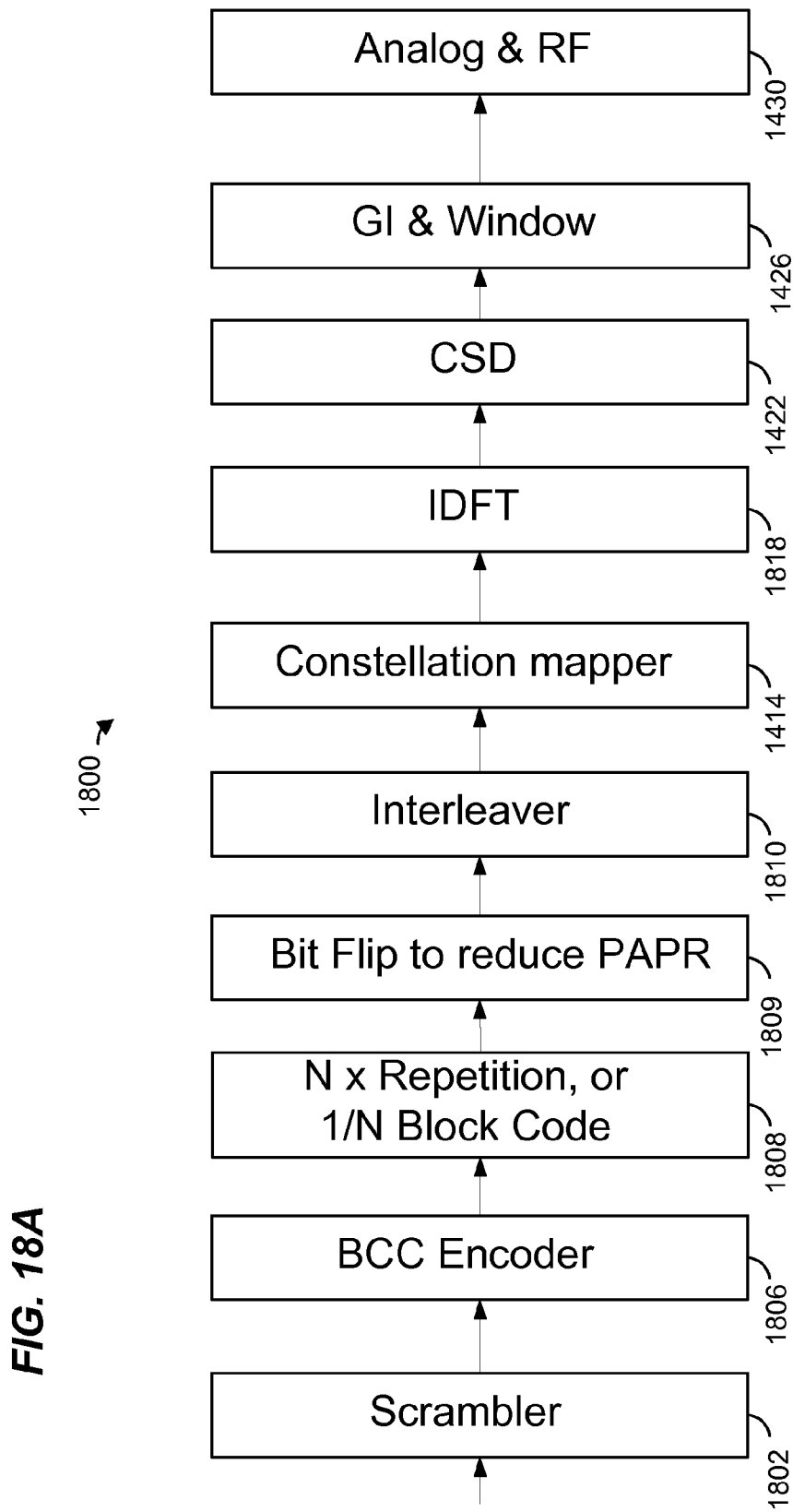
FIG. 18A is a block diagram of an example PHY processing unit for generating control mode data units, according to another embodiment.

FIG. 18A is a block diagram of an example PHY processing unit 1800 for generating control mode data units, according to another embodiment. In some embodiments, the PHY processing unit 1800 generates signal and/or data fields of control mode data units. Referring to FIG. 1, the AP 14 and the client station 25-1, in one embodiment, each include a PHY processing unit such as the PHY processing unit 1800.

The PHY processing unit 1800 is similar to the PHY processing unit 1500 of FIG. 15, except that in the PHY processing unit 1800 the block coding unit 1809 is located after the BCC encoder (1806). Accordingly, in this embodiment, information bits are first encoded by the BCC encoder 1806 and the BCC coded bits are then replicated or otherwise block encoded by the block coding unit 1808. As in the example embodiment of the PHY processing unit 1500, in an embodiment, processing by the BCC encoder 1806 is performed continuously over the entire field being generated (e.g., the entire data portion, the entire signal field, etc.). Accordingly, in this embodiment, information bits corresponding to the field being generated are first encoded by the BCC encoder 1806 and the BCC coded bits are then partitioned into blocks of a specified size (e.g., 6 bits, 12 bits, 13 bits, or any other suitable number of bits). Each block is then processed by the block coding unit 1808. As an example, in one embodiment, the BCC encoder 1806 encodes 12 information bits per OFDM symbol using the coding rate of 1/2 to generate 24 BCC coded bits and provides the BCC coded bits to the block coding unit 1808. In an embodiment, the block coding unit 1808 generates two copies of each incoming block and interleaves the generated bits according to a coding scheme to generate 48 bits to be included in an OFDM symbol. In one such embodiment, the 48 bits correspond to 48 data tones generated using a Fast Fourier Transform (FFT) of size 64 at the IDFT processing unit 1818. As another example, in another embodiment, the BCC encoder 1806 encodes 6 information bits per OFDM symbol using the coding rate of 1/2 to generate 12 BCC coded bits and provides the BCC coded bits to the block coding unit 1808. In an embodiment, the block coding unit 1808 generates two copies of each incoming block and interleaves the generated bits according to a coding scheme to generate 24 bits to be included in an OFDM symbol. In one such embodiment, the 24 bits correspond to 24 data tones generated using an FFT of size 32 at the IDFT processing unit 1818.

Similar to the block coding unit 1504 of FIG. 15, the repetition and coding scheme used by the block coding unit 1808 to generate the signal field of a control mode data unit, depending on an embodiment, is the same as or different from the repetition and coding scheme used by the block coding unit 1808 to generate the data portion of the control mode data unit. In various embodiments, the block coding unit 1808 implements a "block level" repetition scheme or a "bit level" repetition scheme as discussed above in regard to the block coding unit 1504 of FIG. 15. Similarly, in another embodiment, the block coding unit 1808 generates m number of copies of the incoming bits and interleaves the resulting bit stream according to a suitable code, or otherwise encodes incoming bits or incoming blocks of bits using any suitable code, e.g., a Hamming block code with the coding rate of a 1/2, 1/4, etc., or any other block code with the coding rate of 1/2, 1/4, etc. (e.g., (1,2) or (1, 4) block code, (12,24) block code or (6, 24) block code, a (13,26) block code, etc.).

The effective coding rate for data units generated by the PHY processing unit 1800 is a product of the coding rate used by the BCC encoder 1806 and the number of repetitions (or the coding rate) used by the block coding unit 1808, according to an embodiment.

In an embodiment, the block coding unit 1808 provides sufficient diversity gain such that no further interleaving of coded bits is needed, and the interleaver 1810 is omitted. One advantage of omitting the interleaver 1810 is that in this case OFDM symbols with 52 data tones can be generated using 4× or a 6× repetition schemes even though in some such situations the number of data bits per symbol is not an integer. For example, in one such embodiment, the output of the BCC encoder 1806 is partitioned into blocks of 13 bits and each block is repeated four times (or block encoded with a rate of 1/4) to generate 52 bits to be included in an OFDM symbol. In this case, if the BCC encoder utilizes a coding rate of 1/2, the number of data bits per symbol is equal 6.5. In an example embodiment utilizing 6× repetition, the BCC encoder 1806 encodes information bits using a coding rate of 1/2 and the output is partitioned into blocks of four bits. The block coding unit 1808 repeats each four bit block six times (or block encodes each block using a coding rate of 1/6) and adds four padding bits to generate 52 bits to be included in an OFDM symbol.

As in the example of the PHY processing unit 1500 of FIG. 15 discussed above, if padding is used by the PHY processing unit 1800, the number of data bits per symbol ($N_{DBPS}$) used for padding bit computations is the actual number of non-redundant data bits in an OFDM symbol (e.g., 6 bits, 12 bits, 13 bits as in the example above, or any other suitable number of bits). The number of coded bits per symbol ($N_{CBPS}$) used in padding bit computations is equal to the number of bits actually included in an OFDM symbol (e.g., 24 bits, 48 bits, 52 bits, or any other suitable number of bits included in an OFDM symbol).

Also as in the example of the PHY processing unit 1500 of FIG. 15, a number of tail bits are typically inserted into each field of a data unit for proper operation of the BCC encoder 1806, e.g., to ensure that the BCC encoder, after having encoded each field, is brought back to zero state. In one embodiment, for example, six tail bits are inserted at the end of the data portion before the data portion is provided to the BCC encoder 1806 (i.e., after processing by the block coding unit 1504 is performed). Similarly, in the case of a signal field, tail bits are inserted at the end of the signal field before the signal field is provided to the BCC encoder 1806, according to an embodiment. In an example embodiment in which the block coding unit 1808 utilizes a 4× repetition scheme (or another block code with the coding rate of 1/4), the BCC encoder 1806 utilizes the coding rate of 1/2, and the signal field includes 24 information bits (including tail bits), the 24 signal field bits are BCC encoded to generate 48 BCC encoded bits which are then partitioned into four blocks of 12 bits each for further encoding by the block coding unit 1808. Accordingly, in this embodiment, the signal field is transmitted over four OFDM symbols each of which includes 6 information bits of the signal field.

As discussed above with regard to FIGS. 15-17, in some embodiments, the signal field of a control mode data unit is shorter (i.e. includes less bits) compared to a signal field of a normal mode data unit. Accordingly, in these embodiments, less OFDM symbols are generally needed to transmit the signal field compared to embodiments in which a longer signal field is generated using the same repetition and coding scheme.

Further, in some embodiments, the PHY processing unit 1800 generates OFDM symbols with 52 data tones according to the MCSO specified in the IEEE 802.11n Standard or the IEEE 802.11as Standard and the block coding unit 1808 utilizes a 4× repetition scheme. In some such embodiments, extra padding is used to ensure that the resulting encoded data stream to be included in an OFDM symbol includes 52 bits. In one such embodiment, padding bits are added to coded information the bits after the bits have been processed by the block coding unit 1808.

In the embodiment of FIG. 18, the PHY processing unit 1800 also includes a peak to average power ratio (PAPR) reduction unit 1809. In an embodiment, the peak to average power ratio unit reduction 1809 flips the bits in some or all repeated blocks to reduce or eliminate the occurrence of the same bit sequences at different frequency locations in an OFDM symbol thereby reducing the peak to average power ratio of the output signal. In general, bit flipping involves changing the bit value of zero to the bit value of one and changing the bit vale of one to the bit value of zero. According to an embodiment, the PAPR reduction unit 1809 implements bit flipping using an XOR operation. For example, in an embodiment utilizing 4× repetition of a block of coded bits, if a block of coded bits to be included in an OFDM symbols is denoted as C and if C'=C XOR 1 (i.e., block C with bits flipped), then some possible bit sequences at the output of the PAPR reduction unit 1809, according to some embodiments, are [C C' C' C'], [C' C' C' C], [C C' C C'], [C C C C'], etc. In general, any combination of block with bits flipped and blocks with bits not flipped can be used. In some embodiments, the PAPR unit 1809 is omitted.

Figure 18B:
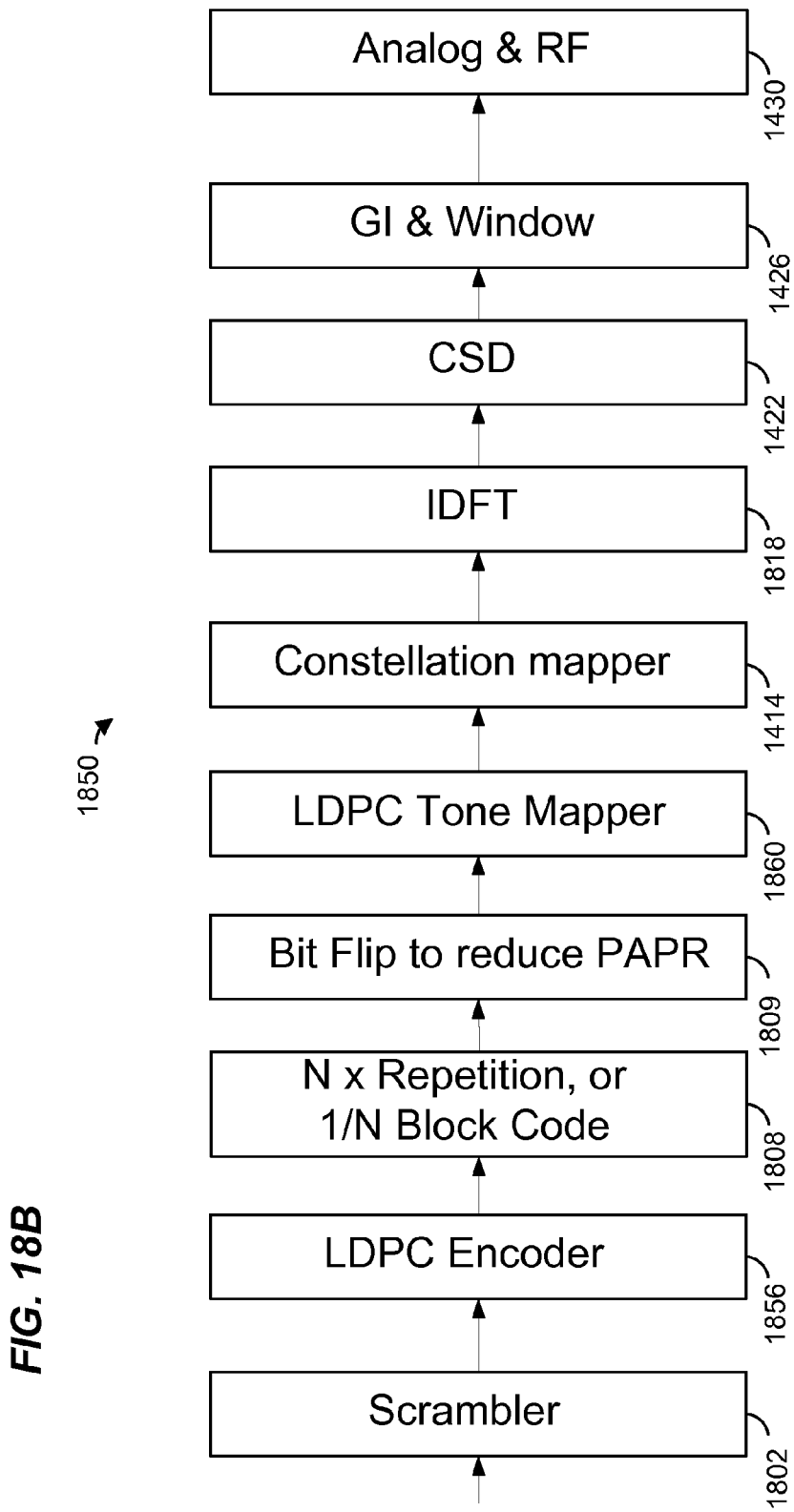
FIG. 18B is a block diagram of an example PHY processing unit for generating control mode data units, according to another embodiment.

FIG. 18B is a block diagram of an example PHY processing unit 1850 for generating control mode data units, according to another embodiment. In some embodiments, the PHY processing unit 1850 generates signal and/or data fields of control mode data units. Referring to FIG. 1, the AP 14 and the client station 25-1, in one embodiment, each include a PHY processing unit such as the PHY processing unit 1850.

The PHY processing unit 1850 is similar to the PHY processing unit 1800 of FIG. 18, except that in the PHY processing unit 1850, the BCC encoder 1506 is replaced by the LDPC encoder 1856. Accordingly, in this embodiment, information bits are first encoded by the LDPC encoder 1856 and the LDPC coded bits are then replicated or otherwise block encoded by the block coding unit 1808. In an embodiment, the LDPC encoder 1856 utilizes a block code corresponding to a coding rate of 1/2, or a block code corresponding to another suitable coding rate. In the illustrated embodiment, the PHY processing unit 1850 omits the interleaver 1810 because adjacent bits in an information stream are generally spread out by the LDPC code itself and, according to an embodiment, no further interleaving is needed. Additionally, in an embodiment, further frequency diversity is provided by the LDPC tone remapping unit 1860. According to an embodiment, the LDPC tone remapping unit 1860 reorders coded information bits or blocks of coded information bits according to a tone remapping function. The tone remapping function is generally defined such that consecutive coded information bits or blocks of information bits are mapped onto nonconsecutive tones in the OFDM symbol to facilitate data recovery at the receiver in cases in which consecutive OFDM tones are adversely affected during transmission. In some embodiments, the LDPC tone remapping unit 1860 is omitted.

Figure 19A:
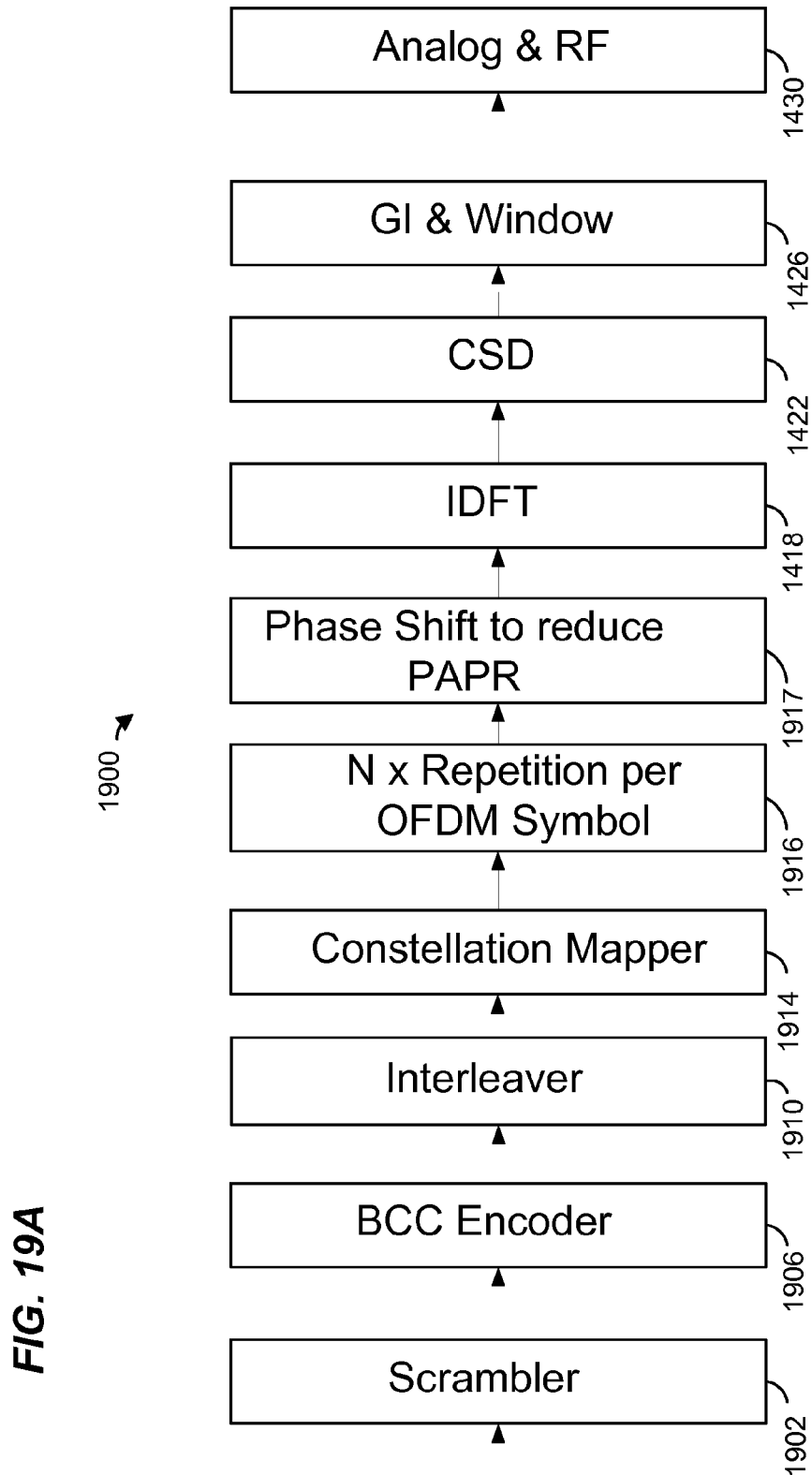
FIG. 19A is a block diagram of an example PHY processing unit for generating control mode data units, according to yet another embodiment.

FIG. 19A is a block diagram of an example PHY processing unit 1900 for generating control mode data units, according to another embodiment. In some embodiments, the PHY processing unit 1900 generates signal and/or data fields of control mode data units. Referring to FIG. 1, the AP 14 and the client station 25-1, in one embodiment, each include a PHY processing unit such as the PHY processing unit 1900.

The PHY processing unit 1900 is similar to the PHY processing unit 1800 of FIG. 18 except that in the PHY processing unit 1900 the block coding unit 1916 is located after the constellation mapper 1914. Accordingly, in this embodiment, BCC encoded information bits, after having been processed by the interleaver 1910, are mapped to constellation symbols and the constellation symbols are then replicated or otherwise block encoded by the block coding unit 1916. According to an embodiment, processing by the BCC encoder 1906 is performed continuously over the entire field being generated (e.g., the entire data field, the entire signal field, etc.). In this embodiment, information bits corresponding to the field being generated are first encoded by the BCC encoder 1806 and the BCC coded bits are then mapped to constellation symbols by the constellation mapper 1914. The constellation symbols are then partitioned into blocks of a specified size (e.g., 6 symbols, 12 symbols, 13 symbols, or any other suitable number of symbols) and each block is then processed by the block coding unit 1916. As an example, in an embodiment utilizing 2× repetition, the constellation mapper 1914 generates 24 constellation symbols and the block coding unit 1916 generates two copies of the 24 symbols to generate 48 symbols corresponding to 48 data tones of an OFDM symbol (e.g., as specified in the IEEE 802.11a Standard). As another example, in an embodiment utilizing 4× repetition, the constellation mapper 1914 generates 12 constellation symbols and the block coding unit 1916 generates four copies of the 12 constellation symbols to generate 48 symbols corresponding to 48 data tones of an OFDM symbol (e.g., as specified in the IEEE 802.11a Standard). As yet another example, in an embodiment utilizing 2× repetition, the constellation mapper 1914 generates 26 constellation symbols and the block coding unit 1916 repeats the 26 symbols (i.e., generates two copies of the 26 symbols) to generate 52 symbols corresponding to 52 data tones of an OFDM symbol (e.g., as specified in the IEEE 802.11n Standard or the IEEE 802.11ac Standard). In general, in various embodiments and/or scenarios, the block coding unit 1916 generates any suitable number of copies of blocks of incoming constellation symbols and interleaves the generated symbols according to any suitable coding scheme. Similar to the block coding unit 1504 of FIG. 15 and the block coding unit 1808 of FIG. 18, the repetition and coding scheme used by the block coding unit 1916 to generate a signal field (or signal fields) of a control mode data unit is, depending on the embodiment, the same as or different from the repetition and coding scheme used by the block coding unit 1916 to generate the data portion of the control mode data unit.

The effective coding rate for data units generated by the PHY processing unit 1900 is a product of the coding rate used by the BCC encoder 1906 and the number of repetitions (or the coding rate) used by the block coding unit 1916, according to an embodiment.

According to an embodiment, because redundancy in this case is introduced after the information bits have been mapped to constellation symbols, each OFDM symbol generated by the PHY processing unit 1900 includes less non-redundant data tones compared to OFDM data tones included in a normal mode data units. Accordingly, the interleaver 1910 is designed to operate on less tones per OFDM symbol compared to the interleaver used in the normal mode (such as the interleaver 1410 of FIG. 14), or the interleaver used in generating the corresponding short range data unit. For example, in an embodiment with 12 non-redundant data tones per OFDM symbol, the interleaver 1910 is designed using the number of columns (Ncol) of 6 and the number of rows (Nrow) of 2*the number of bits per subcarrier (Nbpscs). In another example embodiment with 12 non-redundant data tones per OFDM symbol, the interleaver 1910 is designed using Ncol of 4 and Nrow of 3*Nbpscs. In other embodiments, other interleaver parameters different from interleaver parameter used in the normal mode are utilized for the interleaver 1910. Alternatively, in an embodiment, the block coding unit 1916 provides sufficient diversity gain such that no further interleaving of coded bits is needed, and the interleaver 1910 is omitted. In this case, as in the example embodiment utilizing the PHY processing unit 1800 of FIG. 18, OFDM symbols with 52 data tones can be generated using 4× or a 6× repetition schemes even though in some such situations the number of data bits per symbol is not an integer.

As in the example embodiment of the PHY processing unit 1500 of FIG. 15 or the PHY processing unit 1800 of FIG. 18 discussed above, if padding is used by the PHY processing unit 1900, the number of data bits per symbol ($N_{DBPS}$) used for padding bit computations is the actual number of non-redundant data bits in an OFDM symbol. (e.g., 6 bits, 12 bits, 13 bits as in the example above, or any other suitable number of bits). The number of coded bits per symbol ($N_{CBPS}$) used in padding bit computations is equal to the number of non-redundant bits included in an OFDM symbol which, in this case, corresponds to number of bits in the block of constellation symbols processed by the block coding unit 1916 (e.g., 12 bits, 24 bits, 26 bits, etc.).

Also as in the example embodiment of the PHY processing unit 1500 of FIG. 15 discussed above, a number of tail bits are typically inserted into each field of a data unit for proper operation of the BCC encoder 1906, e.g., to ensure that the BCC encoder, after having encoded each field, is brought back to zero state. In one embodiment, for example, six tail bits are inserted at the end of the data portion before the data portion is provided to the BCC encoder 1906. Similarly, in the case of a signal field, tail bits are inserted at the end of the signal field before the signal field is provided to the BCC encoder 1906, according to an embodiment. In an example embodiment in which the block coding 1916 utilizes a 4× repetition scheme (or another block code with the coding rate of 1/4), the BCC encoder 1906 utilizes the coding rate of 1/2, and the signal field includes 24 information bits (including tail bits), the 24 signal field bits are BCC encoded to generate 48 BCC encoded bits which are then mapped to constellation points by the constellation mapper 1914. The constellation points are then partitioned into four blocks of 12 bits each for further processing by the block coding unit 1808. Accordingly, in this embodiment, the signal field is transmitted over four OFDM symbols each of which includes 6 information bits of the signal field.

As discussed above with regard to FIGS. 15-17, in some embodiments, the signal field of a control mode data unit is shorter (i.e., includes less bits) compared to a signal field of a normal mode data unit. Accordingly, in these embodiments, less OFDM symbols are generally needed to transmit the signal field compared to a longer signal field generated using the same repetition and coding scheme.

In some embodiments, the PHY processing unit 1900 generates OFDM symbols with 52 data tones according to the MCS0 specified in the IEEE 802.11n Standard or the IEEE 802.11as Standard and the block coding unit 1916 utilizes a 4× repetition scheme. In some such embodiments, extra padding is used to ensure that the resulting encoded data stream to be included in an OFDM symbol includes 52 bits. In one such embodiment, padding bits are added to coded information the bits after the bits have been processed by the block coding unit 1808.

In the embodiment of FIG. 19, the PHY processing unit 1900 includes a peak to average power ratio (PAPR) reduction unit 1917. In an embodiment, the peak to average power ratio unit 1917 adds a phase shift to some of the data tones modulated with repeated constellations. For example, in one embodiment the added phase shift is 180 degrees. The 180 degree phase shift corresponds to a sign flip of the bits that modulate the data tones for which phase shifts are implemented. In another embodiment, the PAPR reduction unit 1917 adds a phase shift that is different than 180 degrees (e.g., a 90 degree phase shift or any other suitable phase shift). As an example, in an embodiment utilizing 4× repetition, if a block of 12 constellation symbols to be included in an OFDM symbols is denoted as C and if simple block repetition is performed, the resulting sequence is [C C C C]. In some embodiments, the PAPR reduction unit 1917 introduces a sign flip (i.e., –C) or a 90 degree phase shift (i.e., j*C) for some of the repeated blocks. In some such embodiments, the resulting sequence is, for example, [C –C –C –C], [–C –C –C –C], [C –C C –C], [C C C –C], [C j*C, j*C, j*C], or any other combination of C, –C, j*C, and –j*C. In general, any suitable phase shift can be introduced in any repeated block in various embodiments and/or scenarios. In some embodiments, the PAPR reduction unit 1809 is omitted.

In some embodiments, the PHY processing unit 1900 generates OFDM symbols with 52 data tones according to the MCS0 specified in the IEEE 802.11n Standard or the IEEE 802.11as Standard and the block coding 1916 utilizes a 4× repetition scheme. In some such embodiments, extra pilot tones are inserted to ensure that the resulting number of data and pilot tones in an OFDM symbol is equal to 56 as specified in the short range communication protocol. As an example, in an embodiment, six information bits are BCC encoded at the coding rate of 1/2 and the resulting 12 bits are mapped to 12 constellation symbols (BPSK). The 12 constellation symbols modulate 12 data tones which are then repeated four times the generated 48 data tones. Four pilot tones are added as specified in the IEEE 802.11n Standard and 4 extra pilot tones are added to generate 56 data and pilot tones.

Figure 19B:
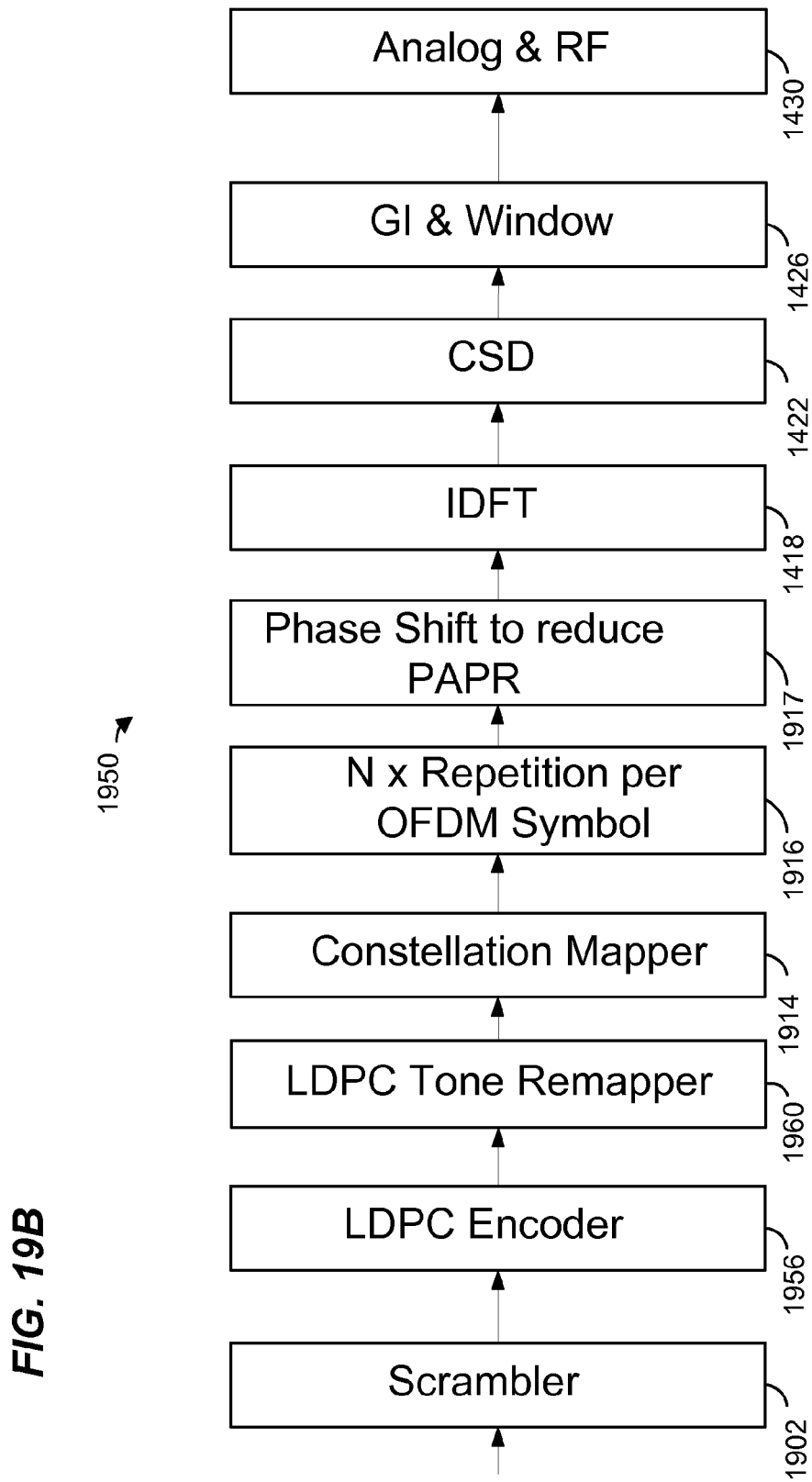
FIG. 19B is a block diagram of an example PHY processing unit for generating control mode data units, according to another embodiment.

FIG. 19B is a block diagram of an example PHY processing unit 1950 for generating control mode data units, according to another embodiment. In some embodiments, the PHY processing unit 1950 generates signal and/or data fields of control mode data units. Referring to FIG. 1, the AP 14 and the client station 25-1, in one embodiment, each include a PHY processing unit such as the PHY processing unit 1950.

The PHY processing unit 1950 is similar to the PHY processing unit 1900 of FIG. 19, except that in the PHY processing unit 1950, the BCC encoder 1906 is replaced by the LDPC encoder 1956. Accordingly, in this embodiment, LDPC encoded information bits are mapped to constellation symbols by the constellation mapper 1914 and the constellation symbols are then replicated or otherwise block encoded by the block coding unit 1916. In an embodiment, the LDPC encoder 1956 utilizes a block code corresponding to a coding rate of 1/2, or a block code corresponding to another suitable coding rate. In the illustrated embodiment, the PHY processing unit 1950 omits the interleaver 1910 because adjacent bits in an information stream are generally spread out by the LDPC code itself and, according to an embodiment, no further interleaving is needed. Additionally, in an embodiment, further frequency diversity is provided by the LDPC tone remapping unit 1960. According to an embodiment, the LDPC tone remapping unit 1960 reorders coded information bits or blocks of coded information bits according to a tone remapping function. The tone remapping function is generally defined such that consecutive coded information bits or blocks of information bits are mapped onto nonconsecutive tones in the OFDM symbol to facilitate data recovery at the receiver in cases in which consecutive OFDM tones are adversely affected during transmission. In some embodiments, the LDPC tone remapping unit 1960 is omitted.

In the embodiments described above with regard to FIGS. 15-19, the control mode introduces redundancy by repeating bits in frequency domain. Alternatively, in some embodiments, OFDM symbol repetition of the signal and/or data fields of control mode data units is performed in time domain. For example, FIG. 20A illustrates a 2× repetition of each OFDM symbol of HT-SIG1 and HT-SIG2 fields in a preamble of a control mode data unit, according to an embodiment. Similarly, FIG. 20B illustrates a 2× repetition of each OFDM symbol of the L-SIG field in a preamble of a control mode data unit, according to an embodiment.

FIG. 20C illustrates a time domain repetition scheme for OFDM symbols in the data portion of a control mode data unit, according to one embodiment. FIG. 20D illustrates a repetition scheme for OFDM symbols in the data portion, according to another embodiment. As illustrated, in the embodiment of FIG. 20C OFDM symbol repetitions are output continuously, while in the embodiment of FIG. 20D OFDM symbol repetitions are interleaved. In general, OFDM symbol repetitions are interleaved according to any suitable interleaving scheme, in various embodiments and/or scenarios.

According to an embodiment utilizing a time domain repetition scheme, pilot tone signs are changed from one tone to the next as specified in the IEEE 802.11a or the IEEE 802.11n, for example. Accordingly, in such embodiments, pilot tones in a repeated OFDM symbol are not the same as in the incoming (original) OFDM symbol in at least some situations.

In some embodiments, the preamble used for a control mode data unit ("control mode preamble") is different compared to the preamble used for a normal mode data unit ("normal mode preamble"). For instance, a control mode preamble includes a longer long training sequence for better channel estimation or a longer short training sequence for better packet detection and synchronization at a receiving device, in some embodiments. In some embodiments, a control mode preamble includes an extra preamble in addition or the normal mode preamble. Further, in some embodiments in which the control mode preamble is different from the normal mode preamble, the control mode preamble is generated such that a receiver is able to determine or auto-detect whether the incoming data unit corresponds to the control mode or to the normal mode and therefore is able to properly decode the data unit.

Figure 21:
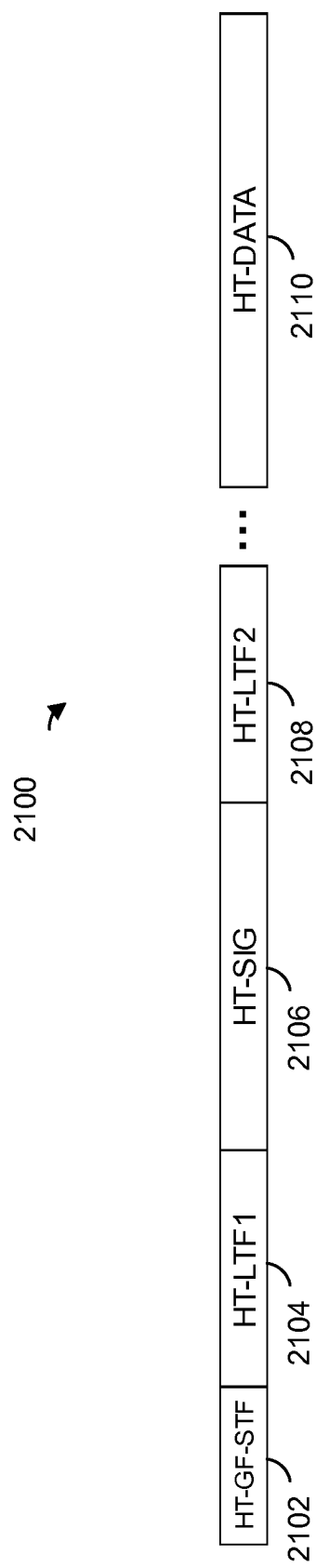
FIG. 21 is a diagram of an example control mode data unit which includes a longer preamble compared to a preamble included in a normal mode data unit, according to an embodiment.

FIG. 21 is a diagram of an example control mode data unit 2100 which includes a longer preamble compared to a preamble included in a normal mode data unit, according to an embodiment. The control PHY data unit 2100 is similar to the normal PHY data unit 1000 of FIG. 10, except that HT-LTF2 field 2108 is longer than each HT-LTF field 1012 of the normal PHY data unit 1000. More specifically, the data unit 2100 includes an HT-LTF2 field 2108 that occupies two OFDM symbols and is transmitted over 80 μs, compared to one OFDM symbol and 40 μs used to transmit each HT-LTF field 1012 of the normal PHY data unit 1000.

Figure 22A:
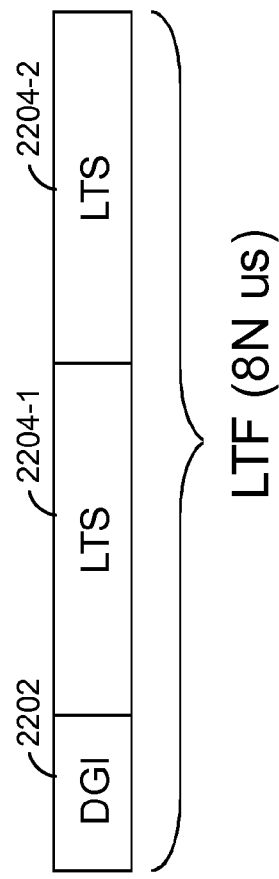
FIG. 22A is a diagram of a long training field of a normal mode data unit, according to an embodiment.
Figure 22B:
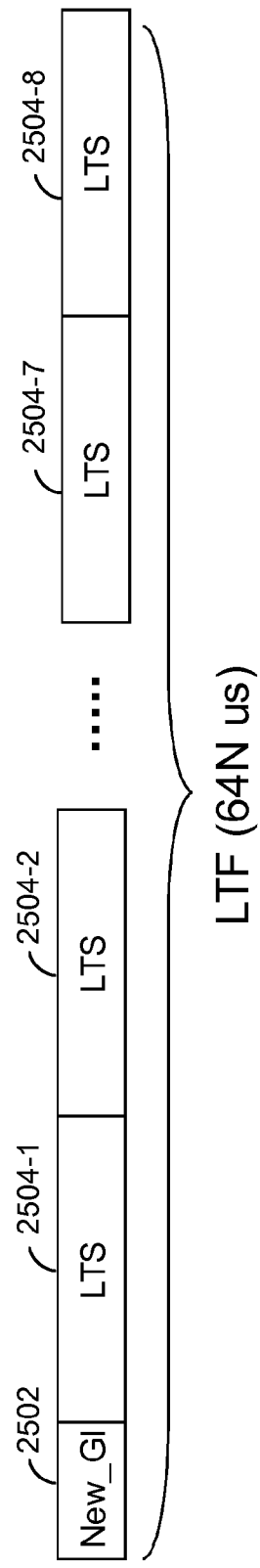
FIG. 22B is a diagram a long training field of a control mode data unit, according to an embodiment.

In an embodiment, a long training field is extended (e.g., by introducing a number of repetitions of the long training sequence used in the normal mode) to span any suitable number of OFDM symbols. FIGS. 22A and 22B illustrate an example embodiment in which more repetitions of a long training sequence are included in a control mode preamble than in a normal mode preamble. In particular, FIG. 22A illustrates a long training field 2200 of a normal mode data unit, according to an embodiment. The long training field 2200 includes a double guard interval (DGI) 2202 and two repetitions of a long training sequence 2204. In one embodiment, DGI is equal to 2×0.8 μs, for example. In another embodiment, a DGI of another suitable value is utilized. As indicated in FIG. 22A, in the illustrated embodiment, duration of the long training field of a normal mode data unit is 8N μs, where N is the down-clock ratio used to generate the data unit.

FIG. 22B is a diagram a long training field 2500 of a control mode data unit, according to an embodiment. The long training field 2500 includes a new guard interval (New GI) field 2502 and eight repetitions of a long training sequence 2504. In one embodiment, the New GI duration is greater than the normal mode DGI duration in the data unit 2200. In another embodiment, New GI duration is the same as the DGI duration in the data unit 2200. As indicated in FIG. 22B, in the illustrated embodiment, the duration of the control mode long training field 2500 is 64N μs. In other embodiments, other suitable numbers of repetition of a long training sequence are utilized and accordingly long training fields of other suitable lengths are generated in normal mode and/or in control mode, where a control mode LTF field is longer than a normal mode LTF field by any suitable factor.

Figure 23:
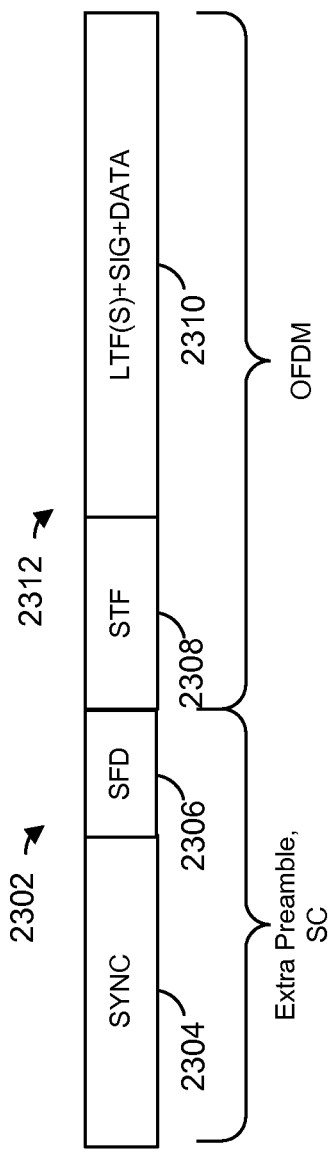
FIG. 23 is a diagram of a control mode OFDM data unit, according to an embodiment.

In another embodiment, a control mode preamble includes an extra preamble in addition to a regular preamble included in the normal mode data units. FIG. 23 is a diagram of a control mode OFDM data unit 2300, according to one such embodiment. The data unit 2300 is similar to the normal mode data unit 1300 of FIG. 13, except that the data unit 2300 includes a single carrier (SC) extra preamble portion 2302. The extra SC preamble 2202 includes a SYNC field 2204 and a SFD field 2206. In an embodiment, the SC preamble of the data unit 2300 is at least substantially the same as PLCP preamble 814 of the data unit 800 (FIG. 8), down-clocked by the same down-clocking factor N as the down-clocking factor used to generate the OFDM portion 2312. In another embodiment, a down-clocking factor used for the SC preamble portion 2302 is different from the down-clocking factor used for the OFDM portion 2212.

Figure 24:
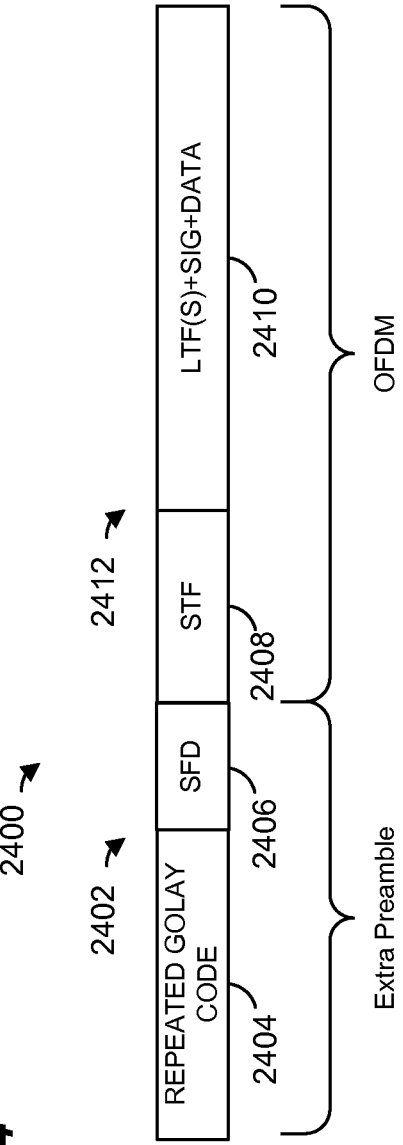
FIG. 24 is a diagram of a control mode OFDM data unit, according to another embodiment.

FIG. 24 is a diagram of a control mode OFDM data unit 2400 utilizing an extra preamble in control mode, according to another embodiment. The data unit 2400 is similar to the data unit 2200 of FIG. 22, except that the SYNC field 2204 is replace by the Golay code field 2304 in FIG. 24. In some embodiments, the Golay code field includes a number of repetitions of a Golay complementary sequence (GCS), for example. The number of repetitions is determined based on the particular Golay sequence length utilized and the overall preamble length of the data unit 1600, in an embodiment. In some embodiments, Golay sequences of length 16, 32, 64, 128, or any other suitable length are utilized. In some embodiments, the long range communication protocol defines a long preamble and a short preamble, each consisting of a different number of Golay sequence repetitions. In one such embodiment, different complimentary sequences are utilized for the long and the short preamble cases (e.g., Ga sequence for the long preamble, and Gb sequence for the short preamble) to allow a receiver determine which type of preamble a received data unit includes. Generally, the two complementary sequences Ga and Gb have correlation properties suitable for detection at a receiving device. For example, the complementary spreading sequences Ga and Gb may be selected so that the sum of corresponding out-of-phase aperiodic autocorrelation coefficients of the sequences Ga and Gb is zero. In some embodiments, the complementary sequences Ga and Gb have a zero or almost-zero periodic cross-correlation. In another aspect, the sequences Ga and Gb may have aperiodic cross-correlation with a narrow main lobe and low-level side lobes, or aperiodic auto-correlation with a narrow main lobe and low-level side lobes.

In some embodiments which include an SC extra preamble portion, for wider bandwidth OFDM data units (e.g., 40 MHz, 80 MHz, 160 MHz, etc.), the SC preamble is repeated in each down-clocked 20 MHz sub-band. In some embodiments, particularly when the single carrier extra preamble is generated using a clock rate that is different from the clock rate used to generated the OFDM portion of the data preamble, the SC/OFDM boundary requirement is defined as specified in the IEEE 802.11g Standard for direct sequence spread spectrum (DSSS) and OFDM boundary requirement. In an embodiment, the start frame delimiter (SFD) field (e.g., SFD field 2306 in FIG. 23, SFD field 2406 in FIG. 24) is used to determine the end of the extra SC preamble. In some embodiments, the STF field (i.e., field 2308 in FIG. 23, filed 2408 in FIG. 24) is omitted.

In some embodiments, the control mode preamble includes an extended short training field of a normal mode preamble. The longer short training field is used to improve packet detection and better syncing at the receiver, for example. In one such embodiment, the number of periods included in a short training field of a control mode preamble is greater than the number of periods included in a normal mode preamble. In another embodiment, duration of each period in a short training field of a control mode preamble is longer compared to the duration of each period in a short training field of a normal mode preamble. In another embodiment, the number of periods included in a short training field of a control mode preamble is greater than the number of periods included in a normal mode preamble and each period in the control mode short training field is longer compared to each period in the normal mode short training field.

Figure 25A:
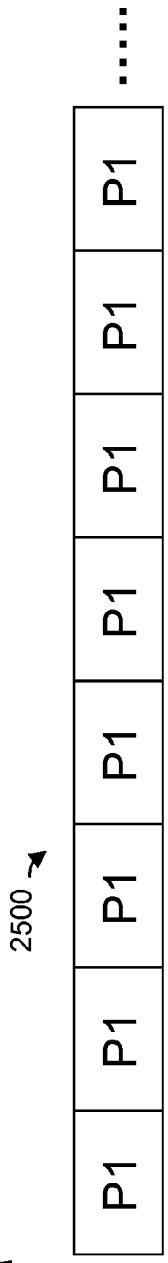
FIGS. 25A and 25B are diagrams of a short training sequence subfield and a short training sequence subfield included in a control preamble and a normal mode preamble, respectively, according to an embodiment.
Figure 25B:
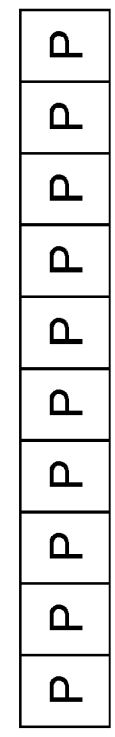

FIGS. 25A and 25B are diagrams of a short training sequence subfield 2500 and a short training sequence subfield 2550 included in a control preamble and a normal mode preamble, respectively, according to an embodiment. As illustrated, in this embodiment, duration of each period of the short training field 2500 is greater than duration of each period of the short training field 2550 by a factor of two. In an embodiment, the longer short training sequence is generated by including more non-zero tones in each OFDM symbol of a control mode short training sequence compared to the number of non-zero tones included in each OFDM symbol of a normal mode short training field. In general, each period of a short training sequence does not include a repetition pattern. Therefore, in an embodiment, the longer short training sequence of a control mode preamble will not trigger a correlator that is used for detecting normal mode data units at a receiving device. In other words, this format allows a receiving device to differentiate between the two modes based on repetition pattern detection in an Inverse Fast Fourier Transform (IFFT) window at the receiving device.

Figure 25C:
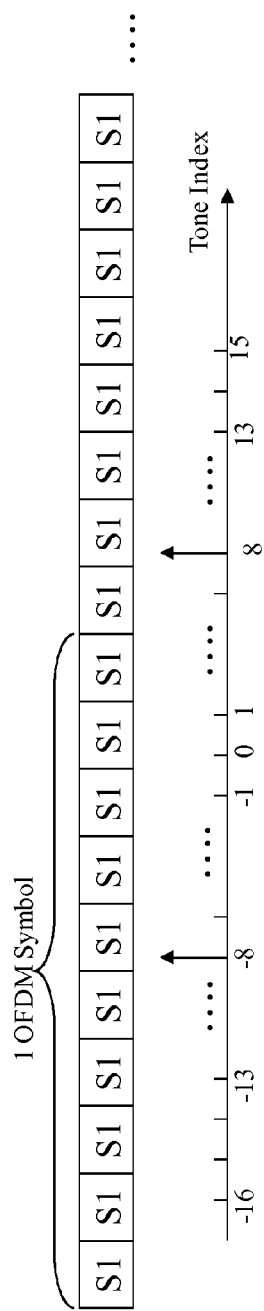
FIG. 25C illustrates frequency domain values corresponding to a short training sequence of FIG. 25A, according to an embodiment.

FIG. 25C illustrates frequency domain values corresponding to the short training sequence 2500, according to an embodiment. As illustrated in FIG. 25C, in this embodiment, each OFDM symbol of the short training field 2550 includes non-zero values corresponding to the +/−8 OFDM tone indices. In one embodiment, the values of the two non-zero tones are such that $p(-8)!=p(8)$ and $p(-8)!=-p(8)$. In general, any values for which these criteria are satisfied are used as specific non-zero tone values, in various embodiments and/or scenarios. As an example, in one embodiment, the specific values for the two non-zero tones are defined as:

$$[p(8), p(-8)] = a^*[\mathrm{sqrt}(2), 1+j] \quad \text{Equation 1}$$

where a is a scaling factor.

Figure 26A:
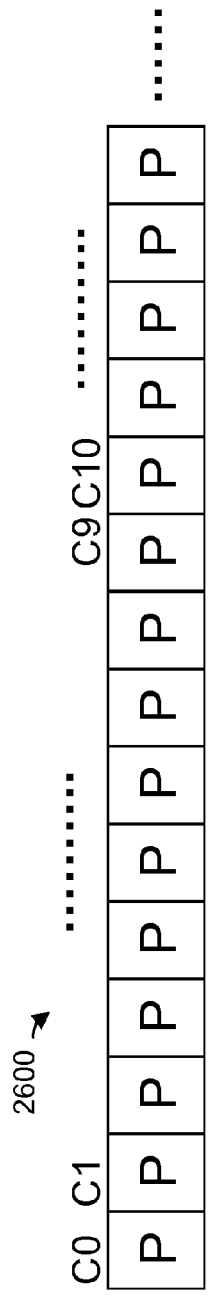
FIGS. 26A-26B are diagrams of a control mode short training sequence and a normal mode short training sequence, respectively, according to an embodiment.
Figure 26B:
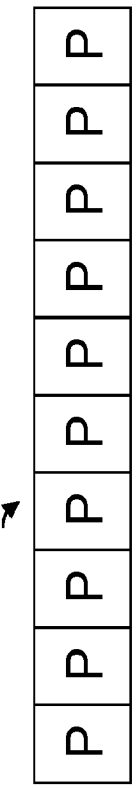
Figure 26C:
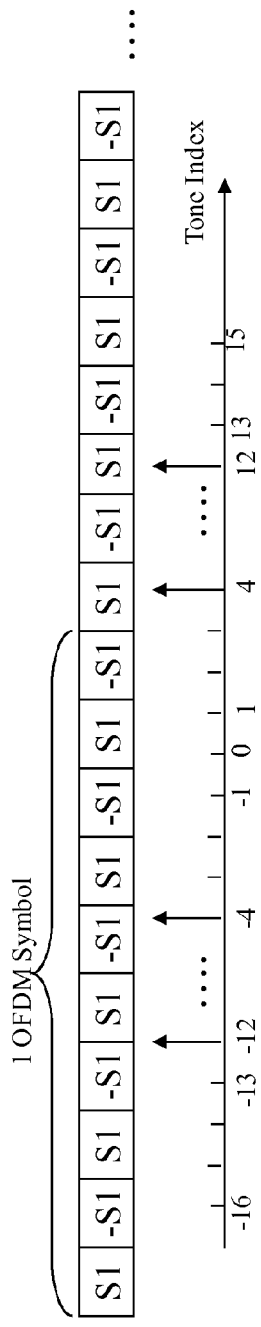
FIG. 26C illustrates frequency domain values corresponding to the short training sequence of FIG. 26A, according to an embodiment.

FIGS. 26A-26B are diagrams of a control mode short training sequence 2600 and a normal mode short training sequence 2650, respectively, according to an embodiment. In the embodiment of FIGS. 26A-26B, a control mode preamble includes a short training sequence of the same period as the short training sequence of a normal mode preamble, but includes more repetitions of the sequence compared to the number of repetitions included in the normal mode preamble. In an embodiment, the short training sequence in the training field 2650 are encoded according to a predefined code (e.g., alternating +/−1 for consecutive repetitions, or any other suitable predetermined code) thereby allowing a receiving device to distinguish between control mode and normal mode data units based on the short training field.

FIG. 26D illustrates frequency domain values corresponding to the short training sequence 2600 of FIG. 26A in an embodiment in which alternating +1/−1 is applied across the short training sequence repetitions of the short training field 2600, according to an embodiment.

In the illustrated embodiment, each OFDM symbol of the short training field 2600 includes non-zero values corresponding to the −12, −4, 4, and 12 OFDM tone indices. In various embodiments, the specific values of the non-zero tones are such that the values are not equal to each other in absolute value (i.e., non-periodic). As an example, in one embodiment, the specific values of the four non-zero tones are defined as:

$$[p(-12), p(-4), p(4), p(12)] = a^*[-1-j, -1-j, 1+j, -1-j] \quad \text{Equation 2}$$

where a is a scaling factor.

In another embodiment in which alternating +1/−1 is applied across the short training sequence repetitions of the short training field, the alternating signs in consecutive training sequence repetitions in control mode are generated by shifting non-zero tones in the sequence to the right or to the left in frequency domain by two tones, for example. As an example, if non-zero tone values are at tones [4, 8, 12, . . . , 24, −4, −8, . . . , −24] in a normal mode short training sequence, then a control mode short training sequence is generated by shifting the normal mode non-zero tones by two with new non-zero tone locations of [6, 10, 14, . . . , 26, −2, −6, . . . , −22] or shifted to the left with new non-zero tone locations of [2, 6, 10, 14, . . . , 22, −6, −10, . . . , −22, −26]. In another embodiment, in addition to shifting non-zero tones, extra non-zero tones are added in the control mode short training sequence to generate a longer sequence. For example, two extra non-zero tones are added at tone locations 2 and −26, in the example in which non-zero tones are shifted to the right, or at tone locations 26, −2 in the example in which non-zero tones are shifted to the left. In other embodiments, different suitable number of non-zero tones is added in a control mode short training sequence (e.g., 4, 6, 8, etc.), and the added non-zero tones are at other suitable tone locations. Further, in various embodiments, the non-zero tones are of any suitable values.

Figure 27A:
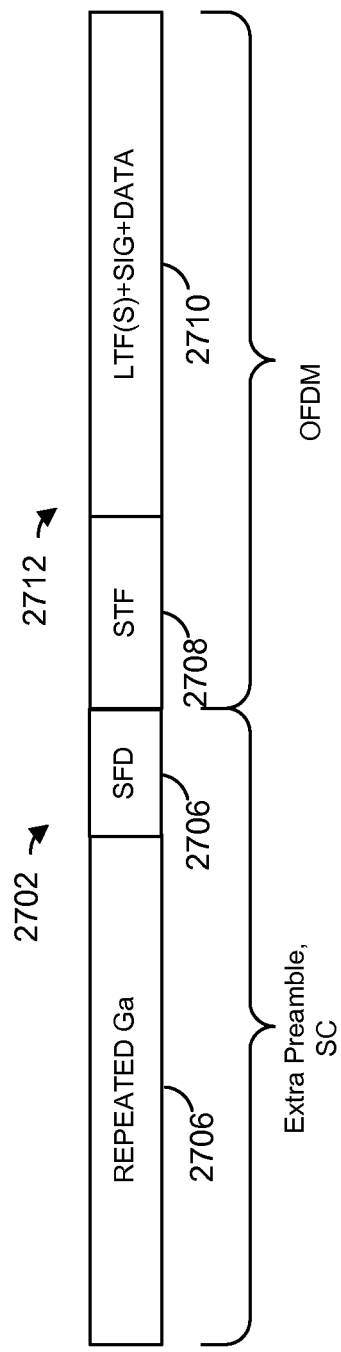
FIGS. 27A and 27B are diagrams of a control mode data unit and a normal mode data unit, respectively, according to an embodiment.
Figure 27B:
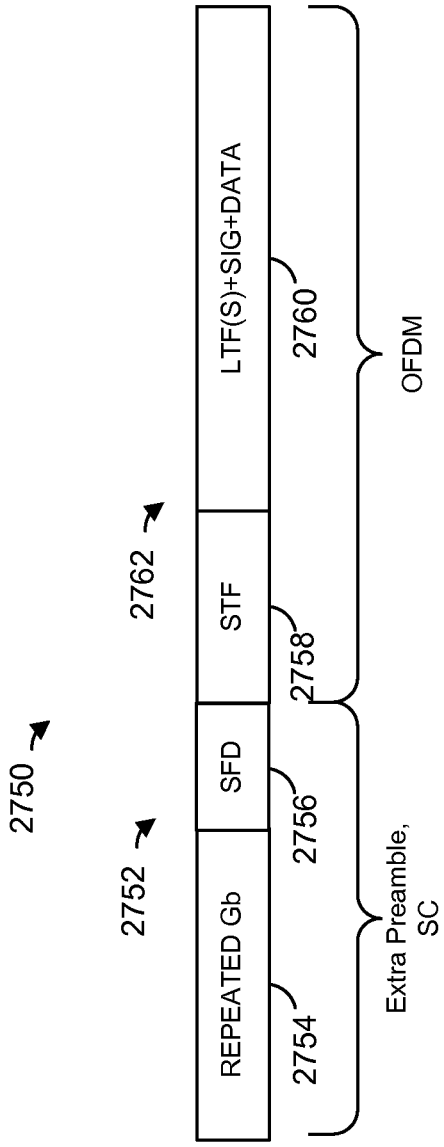

In an embodiment in which the control mode utilizes a single carrier extra preamble in control mode (e.g., data unit 2300 of FIG. 23, data unit 2400 of FIG. 24), a receiver auto-detects whether an incoming data unit is a control mode or a normal mode data unit based on whether the initial signal of the preamble is a single carrier signal or an OFDM signal. In some embodiments, however, a normal mode data unit as well as a control mode data unit includes an extra single carrier preamble. FIGS. 27A and 27B illustrate a control mode data unit 2700 and a normal mode data unit 2750, respectively, according to one such embodiment. In this embodiment, auto-detection at the receiver is based on the different Golay code sequences (GCS) in the control mode and the normal mode data unit. For example, in an embodiment, a length-16 Ga sequence is used for the single carrier preamble portion 2706 of the control mode data unit 2700, while a length-16 Gb sequence is used for the single carrier preamble portion 2754 of the normal mode data unit 2750.

Figures 28A, 28B:
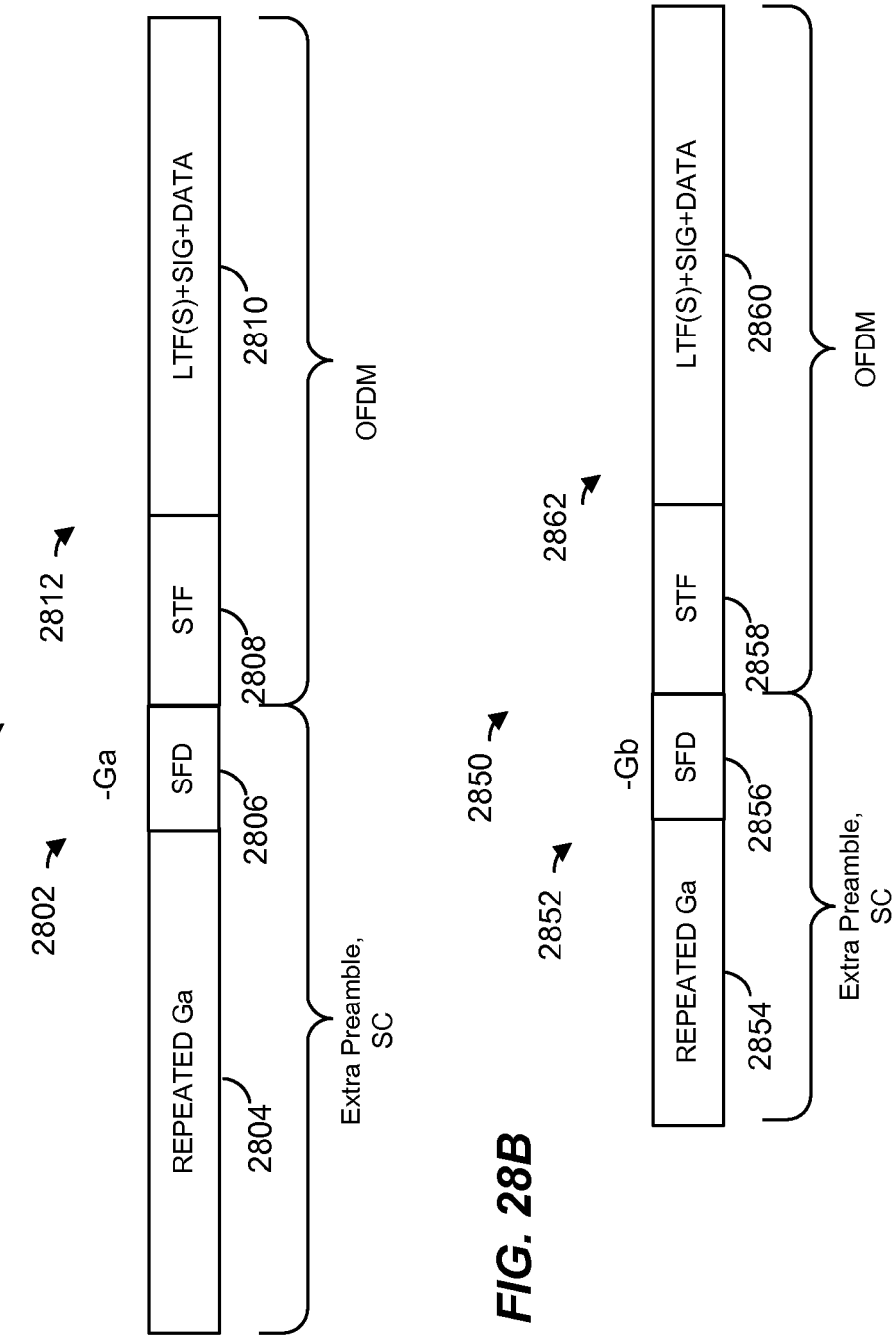
FIGS. 28A-28B are diagrams of a control mode data unit and a normal mode data unit, respectively, according to another embodiment.

FIGS. 28A-28B illustrate a control mode data unit 2800 and a normal mode data unit 2850, respectively, according to another embodiment in which a single carrier extra preamble is utilized in the control mode as well as in the normal mode. In this embodiment, each the SC preamble portions 2806 and the SC preamble portion 2854 is generated using the same GCS sequence (e.g., Ga), and auto-detection is based on the cover code applied to the corresponding delimiter field 2806 and 2856 (e.g., a sign flip is applied or a different sequence is used for the control mode than for the normal mode).

Figures 29A, 29B:
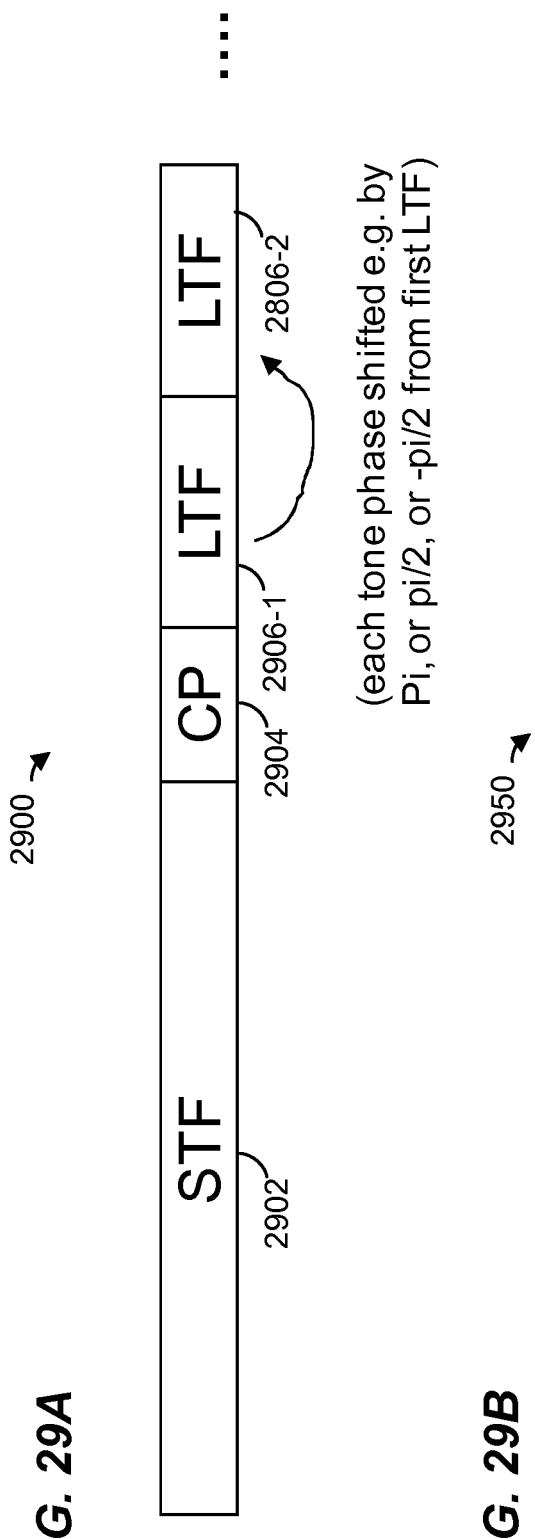
FIGS. 29A-29B are diagrams of a control mode data unit and a normal mode data unit, respectively, according to another embodiment.

FIGS. 29A-29B illustrate a control mode data unit 2900 and a normal mode data unit 2950, respectively, according to an embodiment in which a receiving device can distinguish between the two modes based on modulation of the long training field. To this end, in the control mode data unit 2900, the phase of each tone in the field second OFDM symbol of the LTF (2906-2) is shifted (e.g., by pi, pi/2, −pi/2, or any other suitable factor) compared to the phase of the corresponding OFDM tone of the first OFDM symbol of the LTF (2956-1). On the other hand, no phase shift is introduced for the second symbol of the LTF field (2956-2) of the normal mode data unit 2950.

Figure 30A:
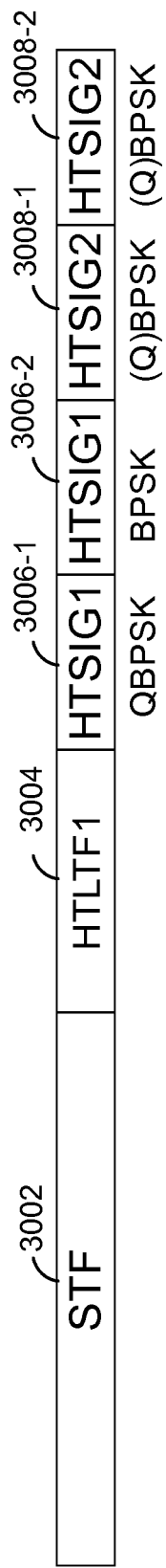
FIGS. 30A-30B are diagrams of a control mode data unit and a normal mode data unit, respectively, according to another embodiment.
Figure 30B:
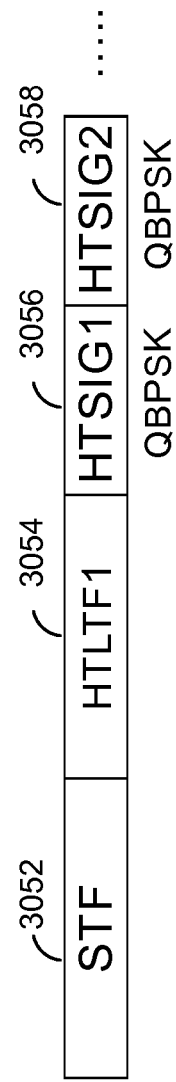

In some embodiments, mode auto-detection at a receiving device is based on the modulation of certain preamble fields. FIGS. 30A-30B illustrate a control mode preamble 3000 and a normal mode preamble 3050, respectively, according to one such embodiment. The control mode preamble 3000 includes a short training field (STF) 3002, a long training field (LTF) 3004, a first signal field (SIG1) 3006, and a second signal field (SIG2) 3008. Similarly, the normal mode preamble 3050 includes a short training field (STF) 3052, a long training field (LTF) 3054 and a first signal field (SIG1) 3056 and a second signal field (SIG2) 3058. In this embodiment, the control mode preamble STF field 3002 is longer than the normal mode preamble STF field 3052. In another embodiment, the control mode preamble STF field 3002 is the same length as the normal mode preamble STF field 3052. Similarly, the control mode preamble LTF field 3004, depending on the embodiment, is longer than or the same length as the normal mode preamble LTF field 3504.

With continued reference to FIGS. 30A-30B, each of the two control mode preamble signal fields is generated using one of the block coding schemes or a time domain repetition scheme discussed above. As a result, in this embodiment, each signal field in the control mode preamble (SIG1 3006 and SIG2 3008) spans two OFDM symbols, while each signal field in the normal mode preamble (SIG1 3056 and SIG2 3058) spans one OFDM symbol. In another embodiment, each of the control mode signal fields 3006 and 3008 spans four OFDM symbols or any other suitable number of OFDM symbols. In the embodiment of FIGS. 30A-30B, each signal field of the normal mode preamble (SIG1 3056 and SIG2 3058) is modulated using QPSK modulation. The second symbol of the first signal filed of the control mode preamble, which is received at the same time after the long training field as the second signal field of the normal mode preamble, is modulated using BPSK modulation. Accordingly, in this embodiment, a receiving device is able to auto-detect whether a data unit corresponds to the control mode or to the normal mode based on the modulation of second OFDM symbol after the LTF field. In another embodiment, the first OFDM symbol of the first signal field is modulated according to a modulation technique that is different from the modulation technique used for modulating the signal fields of a normal mode preamble.

Figure 31A:
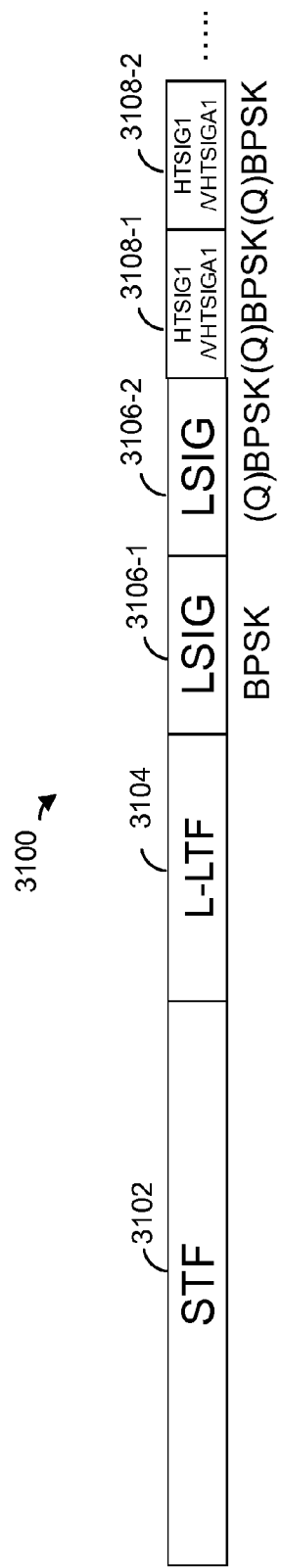
FIGS. 31A-31B are diagrams of a control mode preamble and a normal mode preamble, respectively, according to another embodiment.
Figure 31B:
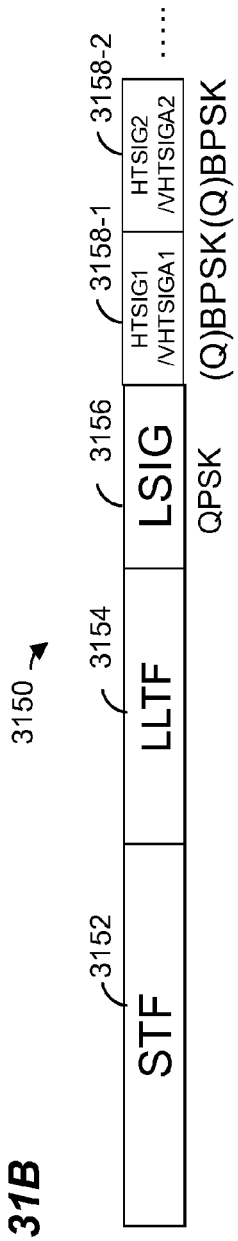

FIGS. 31A-31B illustrate a control mode preamble 3100 and a normal mode preamble 3150, respectively, according to another embodiment. In this embodiment, data units are generated using a short range communication protocol mixed mode preamble format (e.g., data unit 900 of FIG. 9), and mode auto-detecting is based on the different modulation techniques corresponding to the control mode preamble LSIG field 3106 (in this embodiment, QPSK) and the normal mode preamble LSIG field 3156 (in this embodiment, BPSK).

Figure 32A:
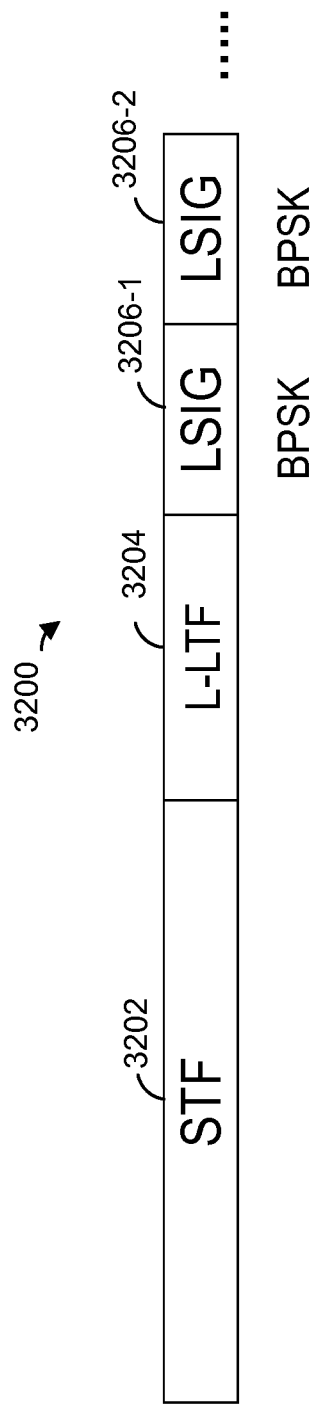
FIGS. 32A-32B are diagrams of a control mode preamble and a normal mode preamble, respectively, according to another embodiment.
Figure 32B:
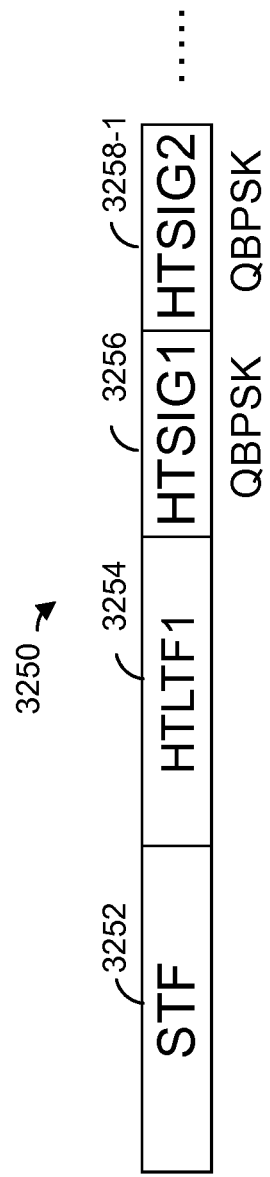

FIGS. 32A-32B illustrate a control mode preamble 3200 and a normal mode preamble 3250, respectively, according to another embodiment. In the illustrated embodiment, normal mode data units are generated using a short range communication protocol green field preamble format (e.g., IEEE 802.11n Standard greenfield preamble format) and control mode data unit are generated using the IEEE 802.11a Standard preamble format utilizing a block coding or a repetition scheme described above. In this embodiment mode auto-detecting is based on the different modulation techniques corresponding to the control mode preamble L-SIG field 3206 (in this embodiment, BPSK) and the normal mode preamble HT-SIG field 3256 (in this embodiment, QPSK).

FIGS. 33A-33B illustrate a normal mode preamble 3300 and a control mode preamble 3350, respectively, according to another embodiment. In the illustrated embodiment, the normal mode preamble 3350 includes more repetitions of a long training sequence than the normal mode preamble 3300. In particular, in this embodiment, the normal mode preamble 3300 includes two repetitions of the long training sequence 3304 while the control mode preamble 3354 includes three or more repetitions of long training sequence 3554. Accordingly, in this embodiment, the signal field 3306 of the normal mode preamble is received at the same point in time (relative to the beginning of the preamble) as the third LTS 3554-3 of the control mode preamble. In the illustrated embodiment, the signal field 3306 is modulated using QBPSK modulation, and the LTS 3554-4 is modulated using BPSK modulation allowing a receiver to auto-detect the mode based on the different modulation techniques.

FIGS. 33C is a diagram of another control mode preamble 3370, according to another embodiment. The control mode preamble 3370 is similar to the control mode preamble 3350 of FIG. 33B, but includes a guard interval before each repeated long training sequence. In an embodiment, in this case, the same mode auto-detection scheme as discussed above in respect to FIGS. 33A-33B is used to distinguish between the normal mode preamble 3300 and the control mode preamble 3370.

FIGS. 34A-34B illustrate a control mode preamble 3400 and a normal mode preamble 3450, respectively, according to another embodiment. In this embodiment, the control mode preamble 3450 includes a short training sequence with a different period compared to the period of the short training sequence of the normal mode preamble 3400, and also includes more repetitions of the long training sequence as in the control mode preamble 3350 of FIG. 33B or the control mode preamble 3370 of FIG. 3C. As illustrated, mode auto-detection in this embodiment is based on the modulation of the signal field 3408 and the long training sequence 3454-3 in the manner described above with respect to FIGS. 33A-33C.

Figure 35:
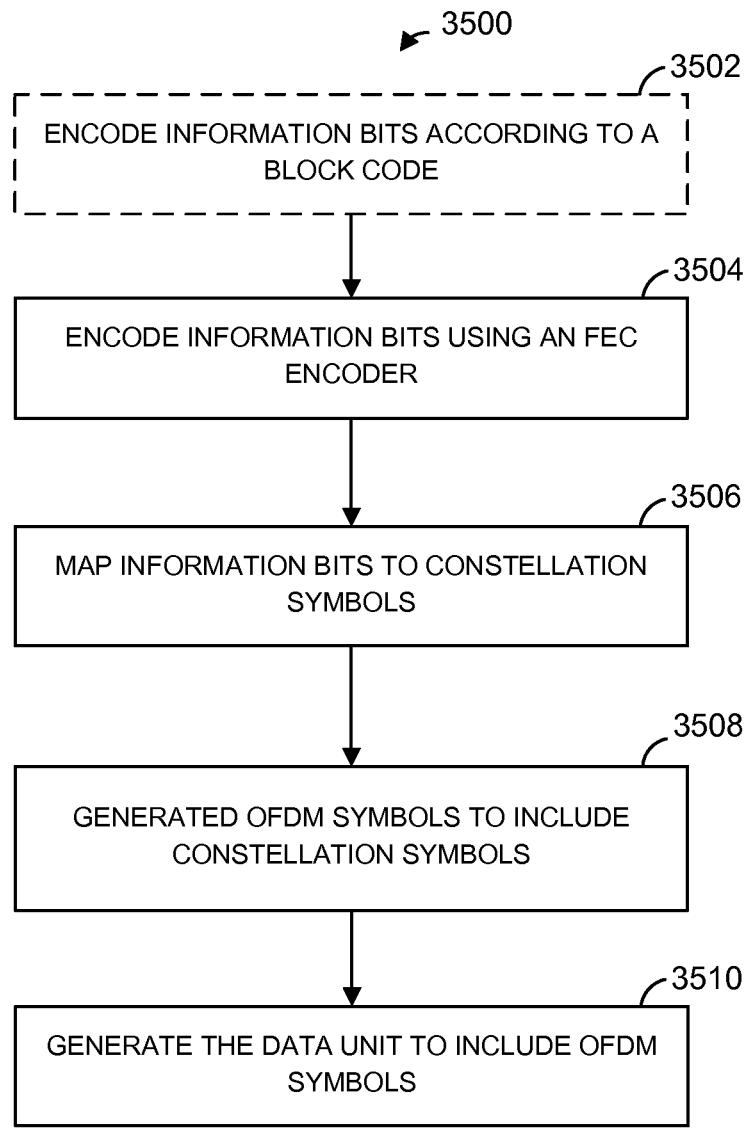
FIG. 35 is a flow diagram of an example method for generating a data unit, according to an embodiment.

FIG. 35 is a flow diagram of an example method 3500 for generating a data unit, according to an embodiment. With reference to FIG. 1, the method 3500 is implemented by the network interface 16, in an embodiment. For example, in one such embodiment, the PHY processing unit 20 is configured to implement the method 3500. According to another embodiment, the MAC processing 18 is also configured to implement at least a part of the method 3500. With continued reference to FIG. 1, in yet another embodiment, the method 3500 is implemented by the network interface 27 (e.g., the PHY processing unit 29 and/or the MAC processing unit 28). In other embodiments, the method 1700 is implemented by other suitable network interfaces.

At block 3502 information bits to be included in the data unit are encoded according to a block code. In one embodiment, information bits are encoded using a block level or a bit level repetition scheme described above with respect to the block coding unit 1504 of FIG. 15, for example. At block 3604, the information bits are encoded using an FEC encoder, such as the BCC encoder 1506 of FIG. 15A, or the LDPC encoder 1556 of FIG. 15B, for example. At block 3506, information bits are mapped to constellation symbols. At block 3508, a plurality OFDM symbols is generated to include the constellation points. The data unit is then generated to include the OFDM symbols at block 3510.

In one embodiment, as illustrated in FIG. 35, information bits are encoded using a block encoder first (block 3502) and the block coded bits are then encoded using a BCC encoder (block 3504), such as described above with respect to FIG. 15A, for example. In another embodiment, the order of blocks 3502 and 3504 is interchanged. Accordingly, in this embodiment, information bits are BCC encoded first and the BCC encoded bits are encoded according to a block coding scheme, such as described above with respect to FIG. 18A, for example. In yet another embodiment, block 3502 is positioned after block 3506. In this embodiment, information bits are BCC encoded at block 3504, the BCC encoded bits are mapped to constellation symbols at block 3506, and the constellation symbols are then encoded according to a block coding or repetition scheme, such as described above with respect to FIG. 19A, for example, at block 3502.

Figure 36:
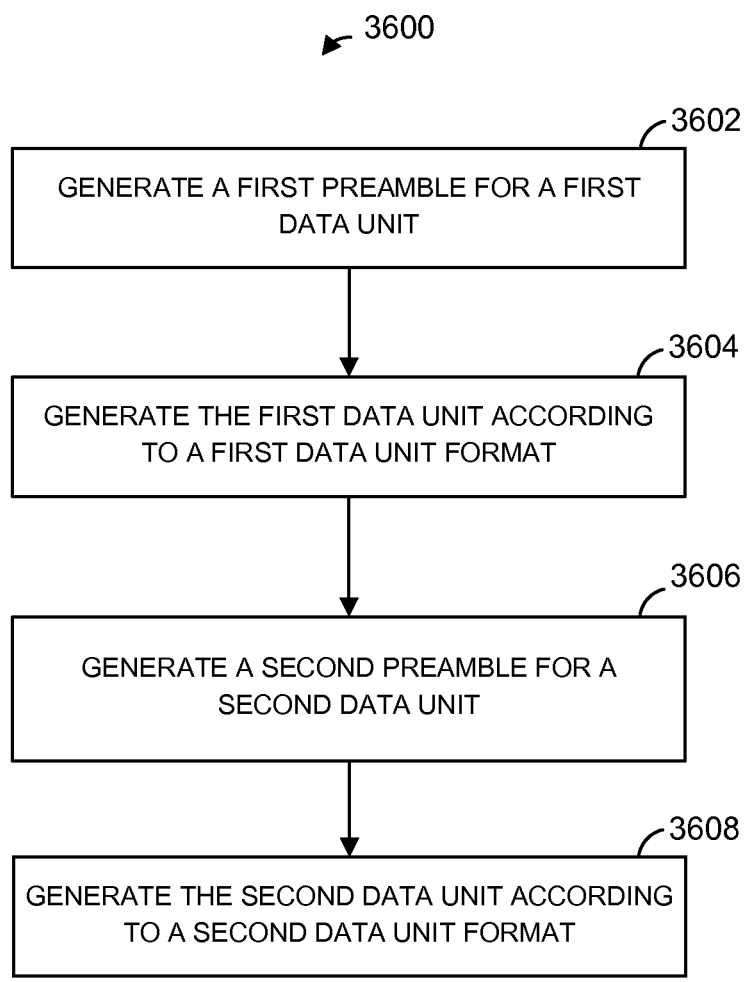
FIG. 36 is a flow diagram of an example method for generating data units, according to an embodiment.

FIG. 36 is a flow diagram of an example method 3600 for generating data units, according to an embodiment. With reference to FIG. 1, the method 3600 is implemented by the network interface 16, in an embodiment. For example, in one such embodiment, the PHY processing unit 20 is configured to implement the method 3600. According to another embodiment, the MAC processing 18 is also configured to implement at least a part of the method 3600. With continued reference to FIG. 1, in yet another embodiment, the method 3600 is implemented by the network interface 27 (e.g., the PHY processing unit 29 and/or the MAC processing unit 28). In other embodiments, the method 1700 is implemented by other suitable network interfaces.

At block 3602, a first preamble for a first data unit is generated. In an embodiment, a normal mode preamble is generated. In an embodiment, the normal mode preamble 3050 of FIG. 30B or the normal mode preamble 3300 of FIG. 33A is generated, for example. In another embodiment, a preamble conforming to another suitable format is generated. In an embodiment, the first preamble includes a long training field and a signal field. The signal field is modulated according to a modulation technique (e.g., BPSK, QPSK, or another suitable modulation technique.)

At block 3606, the second data unit is generated according to the second data unit format (e.g., a normal mode data unit).

At block 3606, a second preamble is generated. In an embodiment, a control mode preamble is generated. For example, the control mode preamble 3050 of FIG. 30A, the control mode preamble 3350 of FIG. 33B, or the control mode preamble 3370 of FIG. 33C is generated. In another embodiment, a preamble conforming to another suitable format is generated. In an embodiment, the second preamble includes a control mode signal field, such as the signal field 1600 of FIG. 16A, the signal field 1700 of FIG. 17C, or the signal field 1780 of FIG. 17C, for example, or another suitable signal field. In an embodiment, the second signal field is generated according to the format of the first signal field and using one of the repetition or block coding schemes discussed above. As a result, duration of the second signal field is longer than the duration of the first signal field. The second preamble also includes a second long training field which includes a number of repetitions of a long training sequence. In some embodiment, the number of repetitions of the long training sequence is greater that the number of long training sequence repetitions in the first long training field (generated at block 3602).

In an embodiment, a portion of the second signal field is modulated according to a modulation technique different from the modulation technique used for generating the first signal field (at block 3602) so that a receiver is able to auto-detect that the second data unit (e.g., control mode data unit) is formatted according to a second data unit format (e.g., control mode data unit format). In another embodiment, the second long training field is modulated according to a modulation technique different from the modulation technique used for generating the first signal field (at block 3602) so that a receiver is able to auto-detect that the second data unit (e.g., control mode data unit) is formatted according to a second data unit format (e.g., normal mode data unit format).

At block 3606, the second data unit is generated according to the second data unit format (e.g., a control mode data unit).

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware instructions may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware instructions may include machine readable instructions that, when executed by the processor, cause the processor to perform various acts.

When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, changes, additions and/or deletions may be made to the disclosed embodiments without departing from the scope of the claims.

What is claimed is:

1. A method for generating a physical layer (PHY) data unit for transmission via a communication channel, the method comprising:
    encoding a plurality of information bits using a convolutional code (BCC) encoder to generate a plurality of BCC coded bits, wherein the BCC encoder continuously encodes incoming information bits information bits are to be included in the PHY data unit;
    partitioning the BCC coded bits into a plurality of blocks of BCC coded bits;
    encoding the plurality of blocks of BCC coded bits according to a block coding scheme to generate a plurality of block coded bits;
    mapping the plurality of block coded bits to a plurality of constellation symbols;
    generating a plurality of orthogonal frequency division multiplexing (OFDM) symbols based on the plurality of constellation symbols; and
    generating the PHY data unit to include the plurality of OFDM symbols.

2. A method according to claim 1, wherein encoding the plurality of blocks of BCC coded bits according to the block coding scheme comprises generating a number of copies of each bit of the plurality of BCC coded bits.

3. A method according to claim 2, wherein each bit of the plurality of blocks of BCC coded bits is repeated m consecutive times, wherein m is an integer greater than 1.

4. A method according to claim 2, wherein each block of the plurality of blocks of BCC coded bits is repeated m consecutive times, wherein m is an integer greater than 1.

5. A method according to claim 2, further comprising interleaving the BCC coded bits in each block of n bits.

6. A method according to claim 2, further comprising flipping of one or more bits of the number of copies of each BCC coded bit.

7. A method according to claim 1, wherein the partitioning the BCC coded bits into a plurality of blocks of BCC coded bits comprises partitioning the BCC coded bits into blocks of n bit, and encoding the plurality of blocks of BCC coded bits according to the block coding scheme comprises
    repeating each bit in each block of n bits m times to generate m*n bits.

8. A method according to claim 7, further comprising interleaving the m*n bits according to a predetermined code.

9. A method according to claim 1, wherein encoding the plurality of blocks of BCC coded bits according to the block coding scheme comprises encoding the blocks of BCC coded bits according to a Hamming code.

10. A method according to claim 1, wherein encoding the blocks of BCC coded bits according to the block code is performed after encoding the blocks of BCC coded bits using the BCC encoder.

11. A method according to claim 1, wherein encoding the blocks of BCC coded bits according to the block code is performed before encoding the blocks of BCC coded bits using the BCC encoder.

12. A method according to claim 1, wherein at least a portion of the plurality of blocks of BCC coded bits corresponds to a data portion of the PHY data unit.

13. A method according to claim 12, wherein generating the PHY data unit further comprises including a preamble in the PHY data unit, and wherein another portion of the plurality of blocks of BCC coded bits corresponds to a signal field of the preamble.

14. An apparatus for generating a PHY data unit for transmission via a communication channel, the apparatus comprising:
    a network interface including
        a binary convolutional code (BCC) encoder configured to encode a plurality of information bits wherein the BCC encoder is configured to continuously encode incoming information bits to generate a plurality of BCC coded bits;
    wherein the network interface is configured to:
        partition the BCC coded bits into a plurality of blocks of BCC coded bits;
        encode the plurality of blocks of BCC coded bits according to a block coding scheme to generate a plurality of block coded bits;
        map the plurality of block coded bits to a plurality of constellation symbols;
        generate a plurality of OFDM symbols to include the plurality of constellation symbols; and
        generate the PHY data unit to include the plurality of orthogonal frequency division multiplexing (OFDM) symbols.

15. An apparatus according to claim 14, wherein encoding the plurality of blocks of BCC coded bits according to the block coding scheme comprises generating a number of copies of each bit of the plurality of BCC coded bits.

16. An apparatus according to claim 15, wherein each bit of the plurality of blocks of BCC coded bits is repeated m consecutive times, wherein m is an integer greater than 1.

17. An apparatus according to claim 15, wherein each block of the plurality of blocks of BCC coded bits is repeated m consecutive times, wherein m is an integer greater than 1.

18. An apparatus according to claim 15, wherein the network interface is further configured to interleave the BCC coded bits in each block of n bits.

19. An apparatus according to claim 15, further comprising a peak to average power ratio (PAPR) reduction unit configured to flip one or more bits of the number of copies of each BCC coded bit.

20. An apparatus according to claim 14, wherein the partitioning the BCC coded bits into a plurality of blocks of BCC coded bits comprises partitioning the BCC coded bits into blocks of n bit, and encoding the plurality of blocks of BCC coded bits according to the block coding scheme comprises repeating each bit in each block of n bits m times to generate m*n bits.

21. An apparatus according to claim 20, wherein the network interface is further configured to interleave the m*n bits according to a predetermined code.

22. An apparatus according to claim 14, wherein encoding the plurality of blocks of BCC coded bits according to the block coding scheme comprises encoding the blocks of BCC coded bits according to a Hamming code.

23. An apparatus according to claim 14, wherein encoding the blocks of BCC coded bits according to the block code is performed after encoding the blocks of BCC coded bits using the BCC encoder.

24. An apparatus according to claim 14, wherein encoding the blocks of BCC coded bits according to the block code is performed before encoding the blocks of BCC coded bits using the BCC encoder.

25. An apparatus according to claim 14, wherein at least a portion of the plurality of blocks of BCC coded bits corresponds to a data portion of the PHY data unit.

26. An apparatus according to claim 25, wherein generating the PHY data unit further comprises including a preamble in the PHY data unit, and wherein another portion of the plurality of blocks of BCC coded bits corresponds to a signal field of the preamble.

\* \* \* \* \*